United States Patent
Liao et al.

(10) Patent No.: US 12,347,735 B2
(45) Date of Patent: Jul. 1, 2025

(54) IN-SITU DEFECT COUNT DETECTION IN POST CHEMICAL MECHANICAL POLISHING

(71) Applicant: TAIWAN SEMICONDUCTOR MANUFACTURING COMPANY LIMITED, Hsin-Chu (TW)

(72) Inventors: Chun-Hung Liao, Taichung (TW); Jeng-Chi Lin, Hsinchu (TW); Chi-Jen Liu, Taipei (TW); Liang-Guang Chen, Hsinchu (TW); Huang-Lin Chao, Hillsboro, OR (US)

(73) Assignee: TAIWAN SEMICONDUCTOR MANUFACTURING COMPANY LIMITED, Hsin-Chu (TW)

( * ) Notice: Subject to any disclaimer, the term of this patent is extended or adjusted under 35 U.S.C. 154(b) by 549 days.

(21) Appl. No.: 17/696,218

(22) Filed: Mar. 16, 2022

(65) Prior Publication Data
US 2023/0298949 A1    Sep. 21, 2023

(51) Int. Cl.
*H01L 21/66* (2006.01)
*B24B 37/005* (2012.01)

(52) U.S. Cl.
CPC .......... *H01L 22/24* (2013.01); *B24B 37/005* (2013.01)

(58) Field of Classification Search
CPC ...................................................... H01L 22/24
See application file for complete search history.

(56) References Cited

U.S. PATENT DOCUMENTS

| | | | | |
|---|---|---|---|---|
| 6,476,921 B1 * | 11/2002 | Saka | ............... | B24B 37/013 451/6 |
| 2003/0045100 A1 * | 3/2003 | Saka | ............... | B24B 49/12 438/689 |
| 2003/0139048 A1 * | 7/2003 | Wong | ............... | B24B 37/042 257/E21.228 |
| 2005/0264802 A1 * | 12/2005 | Shibata | ............ | H01L 21/67028 356/237.5 |

* cited by examiner

*Primary Examiner* — William A Harriston
(74) *Attorney, Agent, or Firm* — Cooper Legal Group, LLC

(57) ABSTRACT

In-situ defect count detection in post chemical mechanical polishing (post-CMP) is provided. Post-CMP is performed, in-situ and according to a recipe, on a surface of a semiconductor wafer within a post-CMP chamber. A light signal is scanned over a target area of the surface of the semiconductor wafer and a reflected light signal reflected from the target area is detected. A defect count of defects present in the target area is determined based on the reflected light signal reflected from the target area.

20 Claims, 20 Drawing Sheets

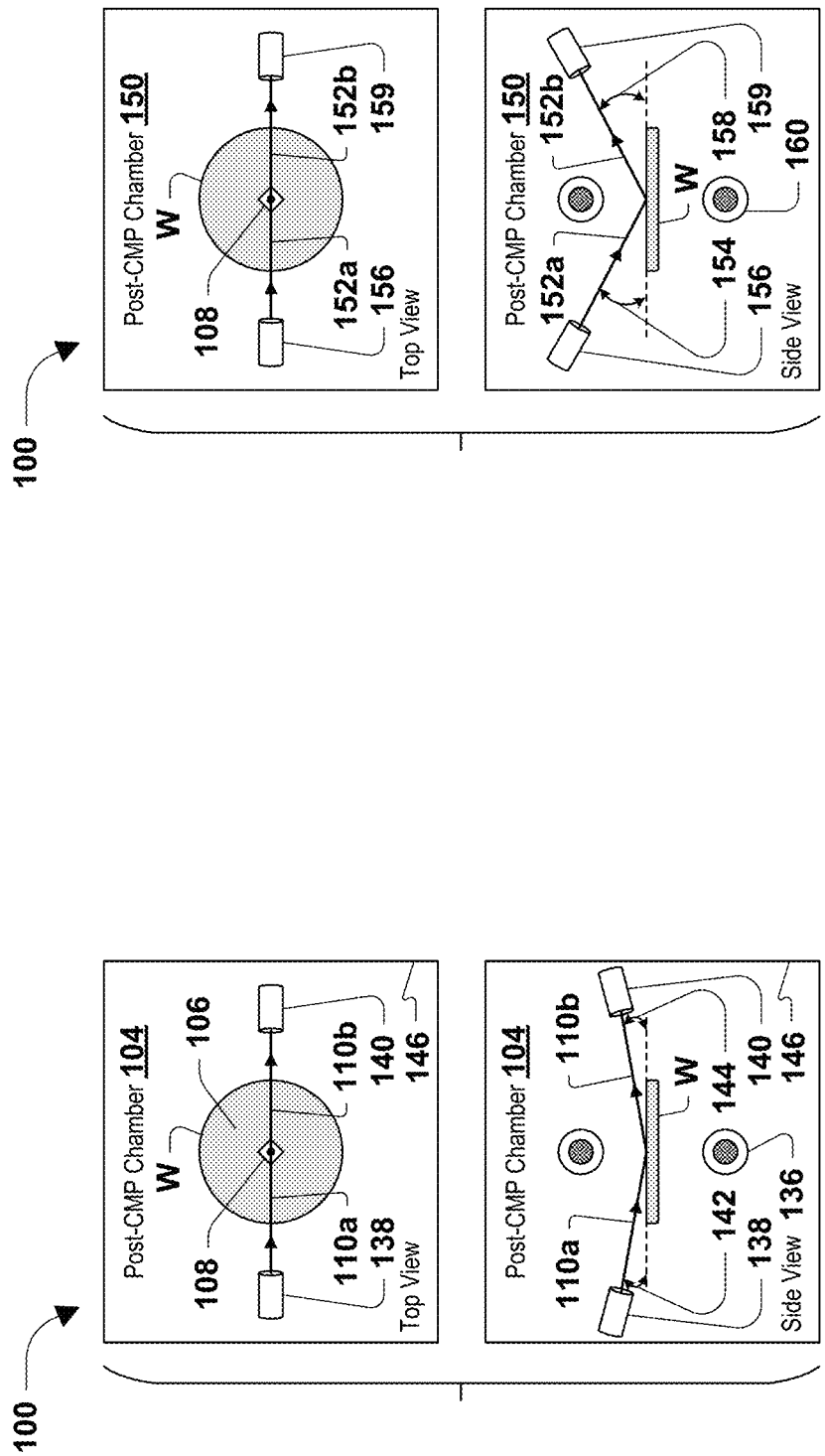

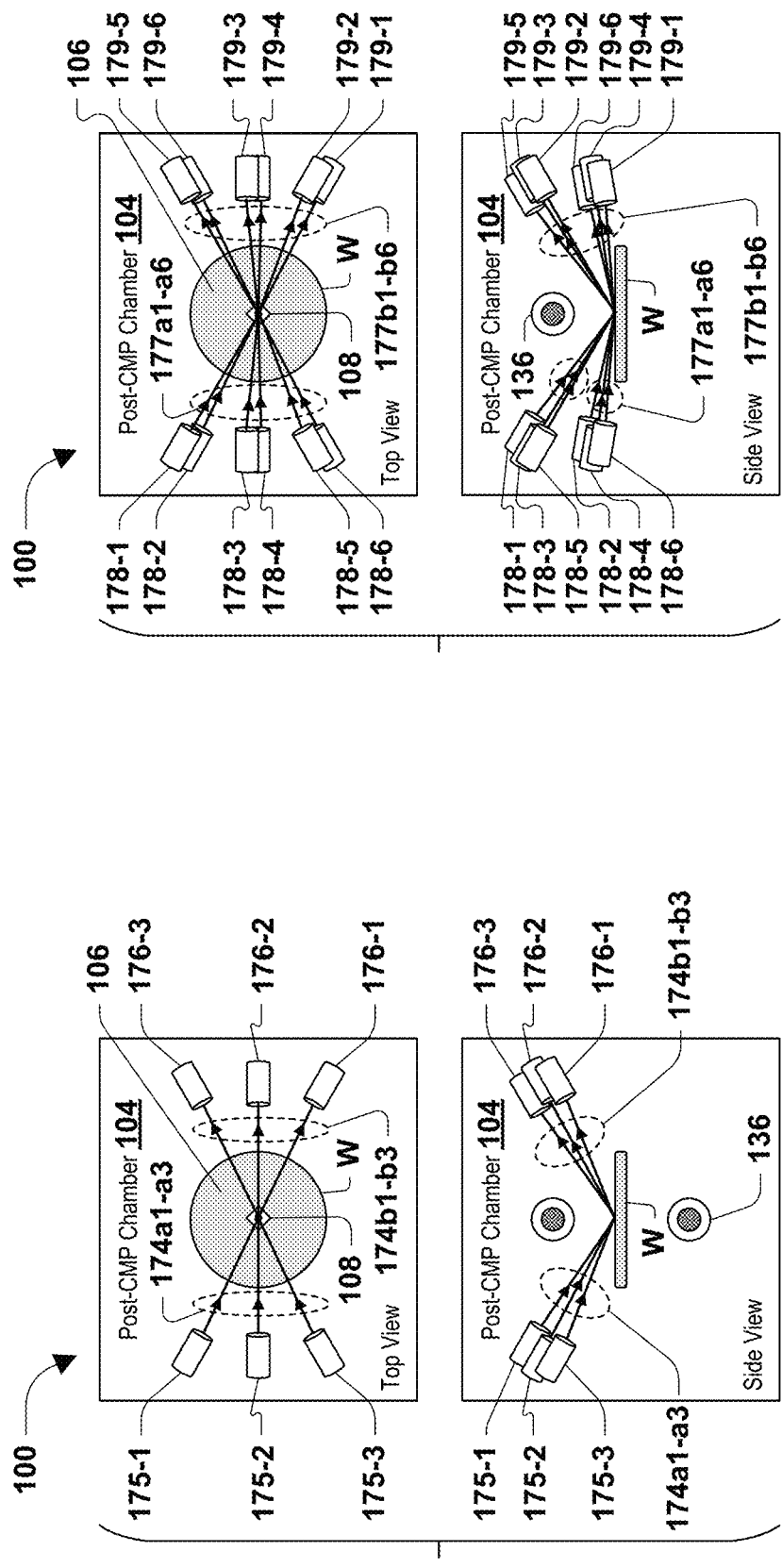

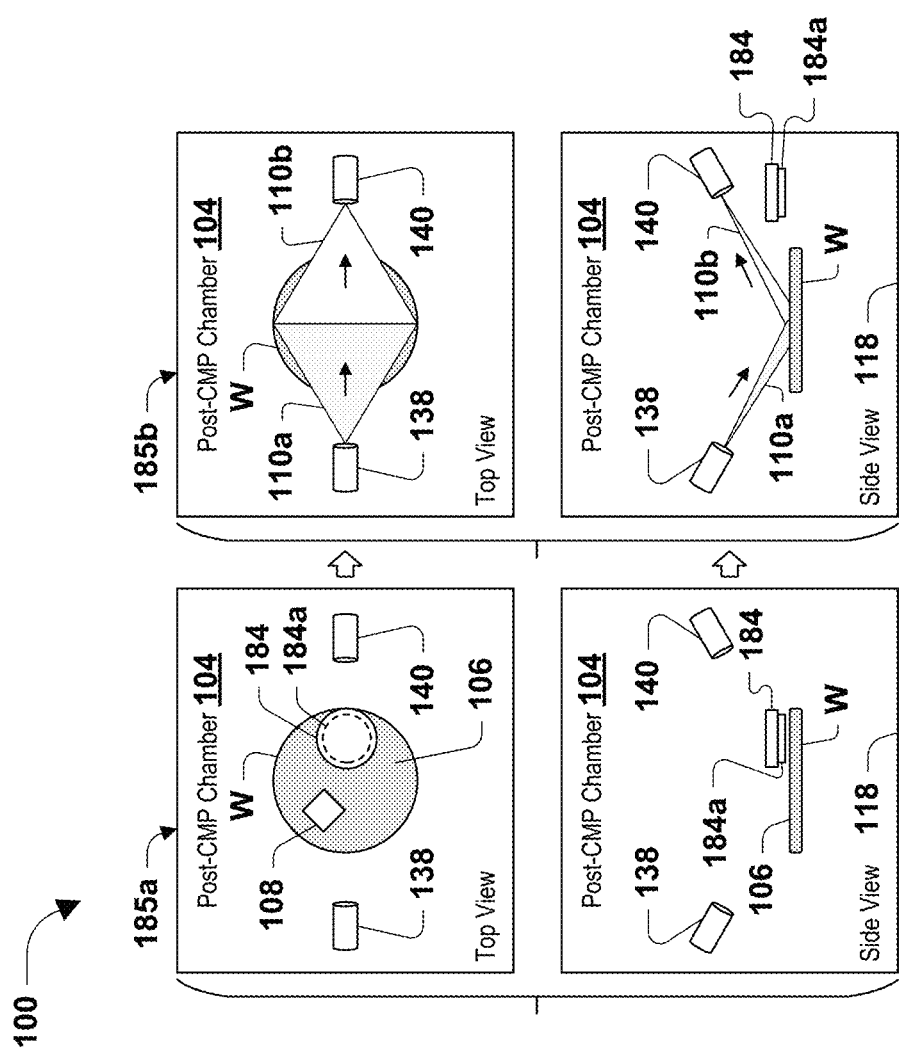

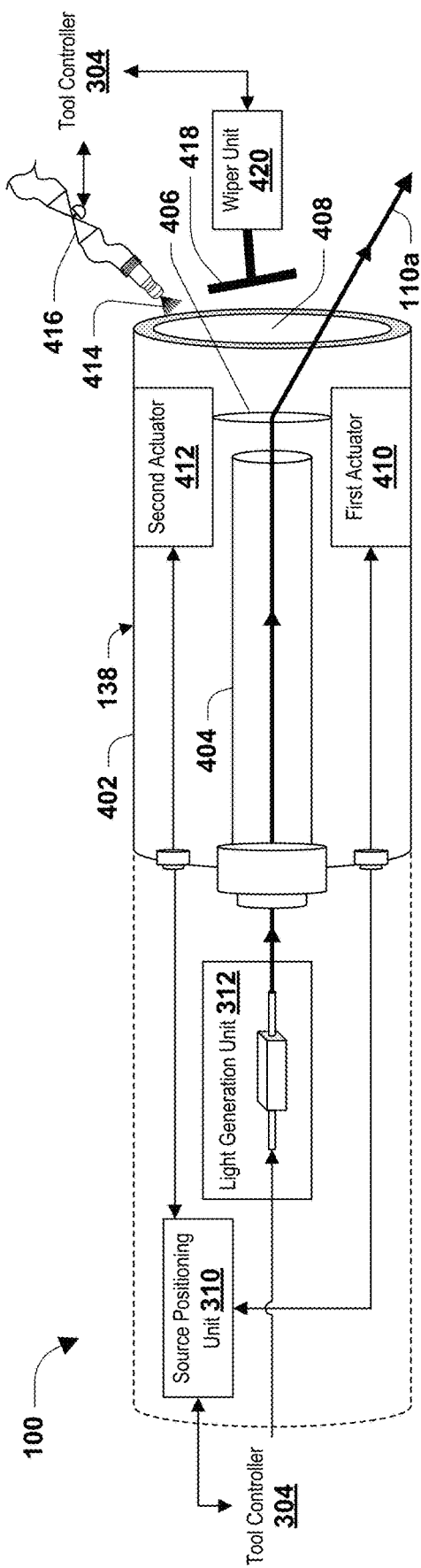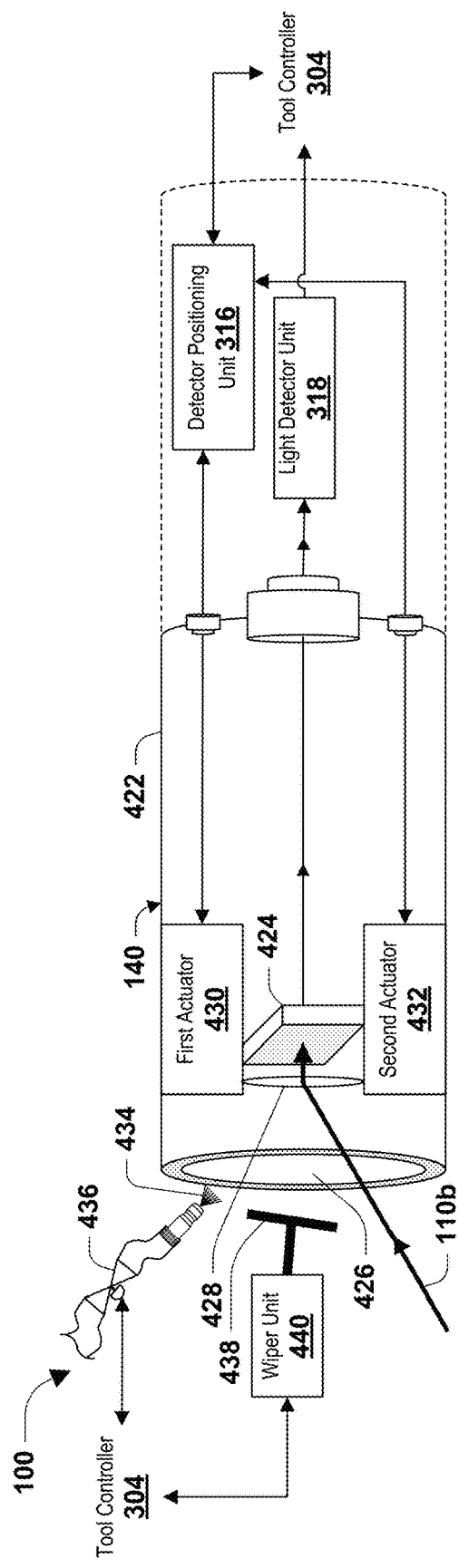
FIG. 4A
FIG. 4B

IN-SITU DEFECT COUNT DETECTION IN POST CHEMICAL MECHANICAL POLISHING

BACKGROUND

Chemical mechanical polishing (CMP) is widely used in the fabrication of integrated circuits (ICs). When an IC is built up layer-by-layer on a surface of a semiconductor wafer, CMP may be used to planarize a topmost layer to provide a planar surface for subsequent fabrication. CMP involves polishing the wafer surface against a polishing pad and applying a slurry to the wafer surface and/or the polishing pad. The slurry typically includes abrasive particles and/or reactive chemicals. A relative movement between the polishing pad and the wafer surface in combination with the slurry planarizes the wafer surface by physical and chemical forces. CMP may be used in the fabrication of various IC components. For example, CMP may be used to planarize inter-level dielectric layers and inter-metal dielectric layers. CMP may also be used in the formation of copper lines that interconnect the various IC components. After CMP, post-CMP may be performed to further process the semiconductor wafer.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1A-1J illustrate an implementation of defect count detection in post-CMP of a semiconductor wafer, according to some embodiments.

FIGS. 4A-4B illustrate an implementation of a light source and a detector, according to some embodiments.

DETAILED DESCRIPTION

Figure 1A:
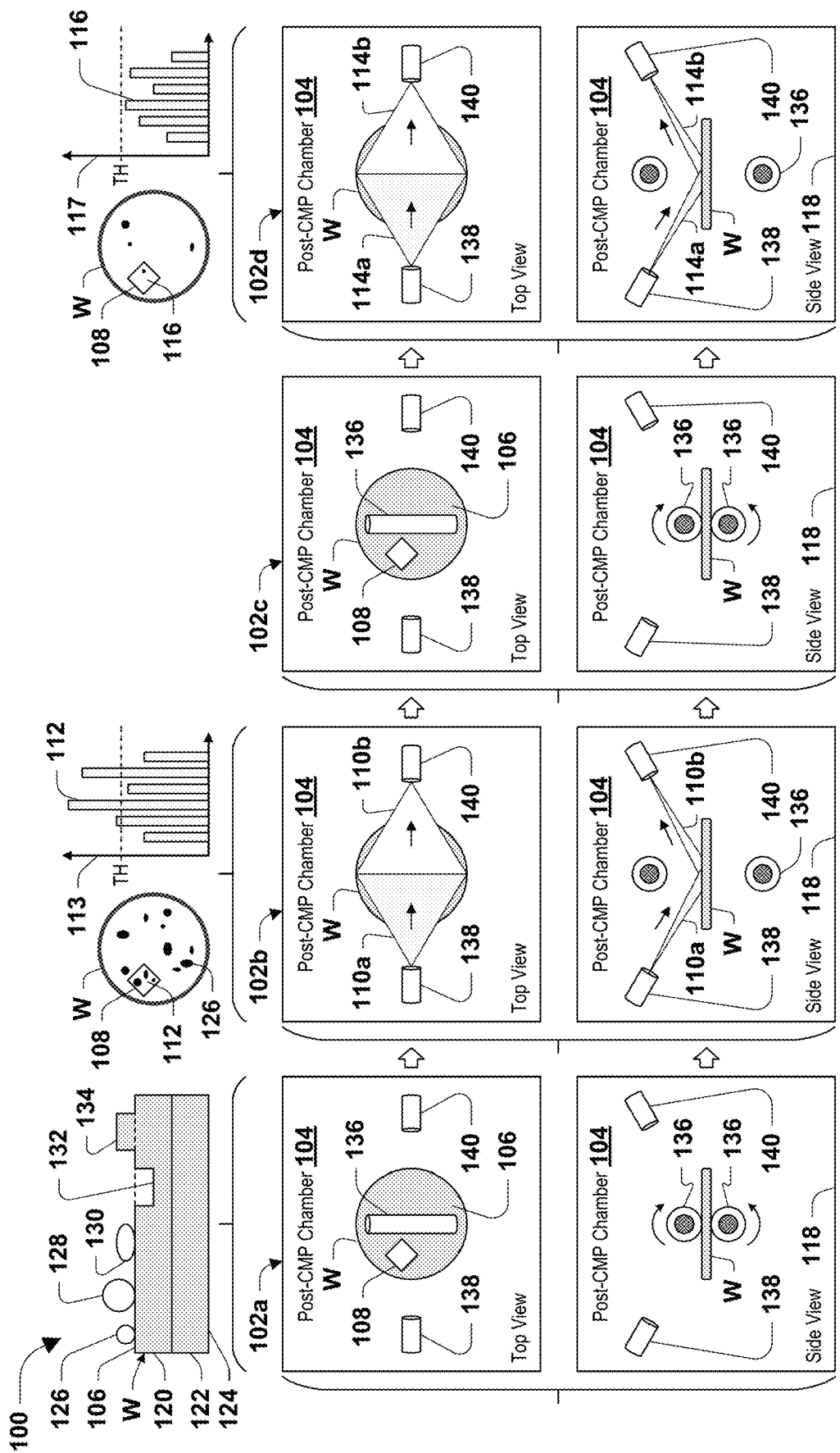

The following disclosure provides several different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact. In addition, the present disclosure may repeat reference numerals or letters in the various examples. This repetition is for the purpose of simplicity and clarity and does not in itself dictate a relationship between the various embodiments or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation illustrated in the figures. The apparatus may be otherwise oriented (rotated 90 degrees or at other orientations) and the spatially relative descriptors used herein may likewise be interpreted accordingly. Also, relationship terms such as "connected to," "adjacent to," "coupled to," and the like, may be used herein to describe both direct and indirect relationships. "Directly" connected, adjacent, or coupled may refer to a relationship in which there are no intervening components, devices, or structures. "Indirectly" connected, adjacent, or coupled may refer to a relationship in which there are intervening components, devices, or structures.

Methods, apparatuses, and/or systems for in-situ defect count detection in post chemical mechanical polishing (post-CMP) are provided. According to some embodiments, post-CMP is performed on a semiconductor wafer to remove residues that may be present as a result of CMP. The residues may include components of a slurry used in CMP and/or components of the semiconductor wafer that have been dislodged and/or removed during CMP but still present on a surface of the semiconductor wafer. The residues may include organic material, inorganic material, particles, abrasives, reactive chemicals, chemical by-products, solvents, etc. According to some embodiments, a defect count may be determined for a number of defects present on the surface of the semiconductor wafer. As set forth herein, defect count detection may be provided with reference to a single or first surface, such as a top surface, of the semiconductor wafer. However, defect count detection may also be performed on a second surface opposite to the first surface, such as through manipulation of the semiconductor wafer into position for detection and/or through provision of multiple light sources and detectors configured to scan and detect the first and second surfaces.

According to some embodiments, defect count detection may be performed sequentially, such that the first surface is detected before the second surface; simultaneously, such that the first surface is detected simultaneously with the second surface; or through various partial combinations of sequential and simultaneous detection. As set forth herein, the defects may include residue on the surface of the semiconductor wafer, or surface topography such as protrusions and/or or cavities. Such surface topography may be changed, formed, enhanced, mitigated, and/or reduced through planarization during CMP. Such surface topography may also be changed, formed, enhanced, mitigated, and/or reduced through post-CMP. The surface topography may vary in response to a type of tool and/or recipe used in post-CMP, and/or may vary in response to a pattern of application of one or more tools. For example, as set forth herein, a portion of the tool may be applied unevenly across the surface of the semiconductor wafer such that the surface topography forms a ridge. In another example, a portion of the tool itself may become depleted, such as less abrasive, after continued application to a number of semiconductor wafers, thereby causing changes to the surface topography of a currently processed semiconductor wafer. According to some embodiments, the above changes and/or other changes to the surface topography of a semiconductor wafer may be detected as defects, which may then be corrected and/or mitigated through changes to a recipe and/or one or more recipe parameters used by a tool during post-CMP.

FIGS. 1A-1J illustrate an implementation 100 of defect count detection in post-CMP of a semiconductor wafer W, according to some embodiments. With reference to FIG. 1A and at 102a, post-CMP is performed, in-situ within a post-CMP chamber 104 and according to a recipe, on a surface 106 of the semiconductor wafer W. As used herein, one or more post-CMP operations may be performed "in-situ," which generally refers to an operation performed on a semiconductor wafer within a referenced post-CMP chamber (e.g., the post-CMP chamber 104). Herein, the term "ex-situ" generally refers to an operation performed in a chamber different from the referenced post-CMP chamber. The surface 106 of the semiconductor wafer W includes a target area 108. At 102b, scanning is performed, in-situ and within the post-CMP chamber 104, with a light signal 110a over the target area 108 of the surface 106 of the semiconductor wafer W. At 102b, detecting is performed, in-situ and within the post-CMP chamber 104, with a reflected light signal 110b reflected from the target area 108. At 102b, determining is performed of a defect count 112 of defects present in the target area 108 based on the reflected light signal 110b reflected from the target area 108. At 102b, the defect count 112 may be compared with a threshold TH as illustrated by a graph 113. At 102c, a second post-CMP may be performed, in-situ and within the post-CMP chamber 104, on the surface 106 of the semiconductor wafer W. The second post-CMP may be performed in response to the defect count 112 of the target area 108 exceeding a threshold TH. In some embodiments, the second post-CMP is performed on an entirety of the surface 106. In some embodiments, the second post-CMP is performed on the target area 108 or a zone of the target area 108. At 102d, a second scanning may be performed, in-situ and within the post-CMP chamber 104, with a second light signal 114a over the target area 108 of the surface 106 of the semiconductor wafer W. At 102d, a second detecting may be performed, in-situ and within the post-CMP chamber 104, with a second reflected light signal 114b reflected from the target area 108. At 102d, a second determining may be performed of a second defect count 116 of defects present in the target area 108 based on the second reflected light signal 114b reflected from the target area 108. At 102d, the second defect count 116 may be compared with the threshold TH as illustrated by a graph 117. According to some embodiments, 102c and 102d may be repeated until the second defect count 116 in the target area 108 does not exceed the threshold TH.

Returning to 102a and according to some embodiments, the semiconductor wafer W is positioned within the post-CMP chamber 104 in a horizontal orientation relative to a bottom surface 118 of the post-CMP chamber 104. The semiconductor wafer W comprises a material layer 120 that is to be worked in post-CMP, such as through scrubbing and/or polishing. The material layer 120 is disposed over a substrate 122 and the surface 106 is on top of the material layer 120. In some embodiments, post-CMP may be performed on a bottom surface 124 of the substrate 122. In the illustrated embodiment, the material layer 120 is disposed directly on the substrate 122. In other embodiments, one or more intervening layers are disposed between the substrate 122 and the material layer 120. The material layer 120 may comprise a metal, an oxide, or other suitable material to be worked in post-CMP. In some embodiments, the material layer 120 comprises silicon dioxide ($SiO_2$), silicon nitride (SiN), poly silicon (Poly-Si), aluminum (Al), tungsten (W), titanium nitride (TiN), titanium (Ti), tantalum nitride (TaN), tantalum (Ta), hafnium oxide ($HfO_x$), zirconium oxide ($ZrO_x$), aluminum zirconium oxide ($AlZrO_x$), titanium aluminum carbide (TiAlC), titanium aluminide (TiAl), cobalt (Co), ruthenium (Ru), amorphous silicon (a-Si), nickel silicide (NiSi), cobalt silicide (CoSi), cobalt nickel silicide (CoNiSi), aluminum oxide ($AlO_x$), iridium oxide ($IrO_x$), copper (Cu), low-k dielectric, silicon oxynitride (SiON), silicon carbonitride (SiCN), nitrogen-free anti-reflective coating (NFARC), silicon oxycarbide (SiOC), silicon carbide (SiC), silicon oxycarbonitride (SiOCN), or other material. As used herein, low-k dielectric refers to dielectric materials have a k-value (dielectric constant) lower than about 3.9. Some low-k dielectric materials have a k-value lower than about 3.5 and may have a k-value lower than about 2.5.

In some embodiments, post-CMP is used for a shallow trench isolation (STI) fabrication process during front-end of line post-CMP to work materials such as silicon dioxide ($SiO_2$), silicon nitride (SiN), or other suitable materials. In some embodiments, post-CMP is used for a gate fabrication process during front-end of line post-CMP to work materials such as poly silicon (Poly-Si), silicon dioxide ($SiO_2$), silicon nitride (SiN), or other suitable materials. In some embodiments, post-CMP is used for an inter-layer dielectric fabrication process during front-end of line post-CMP to work materials such as silicon dioxide ($SiO_2$), silicon nitride (SiN), or other suitable materials. In some embodiments, post-CMP is used for a gate fabrication process during middle-end of line post-CMP work materials such as aluminum (Al), tungsten (W), titanium nitride (TiN), titanium (Ti), tantalum nitride (TaN), tantalum (Ta), hafnium oxide ($HfO_2$), zirconium oxide ($ZrO_x$), aluminum zirconium oxide ($AlZrO_x$), titanium aluminum carbide (TiAlC), titanium aluminide (TiAl), or other suitable materials. In some embodiments, post-CMP is used for a metal plug fabrication process during middle-end of line post-CMP to work materials such as tungsten (W), cobalt (Co), ruthenium (Ru), aluminum (Al), titanium nitride (TiN), titanium (Ti), tantalum nitride (TaN), tantalum (Ta), silicon dioxide ($SiO_2$), silicon nitride (SiN), amorphous silicon (a-Si), zirconium oxide ($ZrO_x$), nickel silicide (NiSi), cobalt silicide (CoSi), cobalt nickel silicide (CoNiSi), aluminum oxide ($AlO_x$), iridium oxide ($IrO_x$), or other suitable materials. In some embodiments, post-CMP is used for a line fabrication process during back-end of line post-CMP to work materials such as copper (Cu), cobalt (Co), ruthenium (Ru), tantalum nitride (TaN), tantalum (Ta), silicon dioxide ($SiO_2$), low-k dielectric, silicon carbonitride (SiCN), nitrogen-free anti-reflective coating (NFARC), silicon carbide (SiC), silicon oxycarbonitride (SiOCN), silicon oxycarbide (SiOC), or other suitable materials.

According to some embodiments, the surface 106 of the semiconductor wafer W includes defects, such as a defect 126. The defect 126 may be present on and/or within the surface 106 of the semiconductor wafer W. The defects may include a particle 128, a residue 130, a cavity 132, a protrusion 134, or other type of defect. The surface 106 of the semiconductor wafer W may be worked by a tool 136 within the post-CMP chamber 104 of a post-CMP apparatus, which is described in greater detail herein. The tool 136 may be configured to scrub at least one surface of the semiconductor wafer W, in-situ and within the post-CMP chamber 104, according to a post-CMP recipe. The at least one surface may include the surface 106 or the bottom surface 124. The at least one surface may include one or more of target areas, such as the target area 108, to be analyzed for defects. The target area 108 may be disposed on the surface 106 or the bottom surface 124 of the semiconductor wafer W, and is described herein with reference to the surface 106 for brevity. In some embodiments, the target area 108 includes a portion of the surface 106 of the semiconductor wafer W that includes functional elements, such as components, devices, structures, and/or interconnect. In some embodiments, the target area 108 includes a portion of the surface 106 of the semiconductor wafer W that does not include functional elements, such as a periphery of the semiconductor wafer W, spaces between functional elements, and/or areas for securing the semiconductor wafer to a stage (e.g., locking structures).

At 102a and according to some embodiments, the target area 108 may be scanned with a light source 138, which may be configured to scan the light signal 110a over the target area 108 in-situ and within the post-CMP chamber 104. The target area 108 may be detected with a detector 140, which may be configured to detect the reflected light signal 110b reflected from the target area 108. In some embodiments, the light source 138 and the detector 140 are not activated while the tool 136 works the surface 106 of the semiconductor wafer W. In some embodiments, the light source 138 and the detector 140 are not activated because the tool 136 may provide interference with the light signal 110a produced by the light source 138 and/or the reflected light signal 110b detected by the detector 140.

At 102a and according to some embodiments, the tool 136 may work the surface 106 of the semiconductor wafer W according to a recipe and/or with one or more recipe parameters. In some embodiments, the recipe may be specific to the tool 136. For example, the recipe may include a sequence of operations and recipe parameters, such as: 1. align the tool 136 in a position with respect to the semiconductor wafer W; 2. rotate the tool 136 with a first parameter, such as a rotational speed of the tool; 3. apply the tool 136 in contact with the semiconductor wafer W at the position and with a second parameter, such as a force of the tool, and with a third parameter, such a time of application; and 4. remove the tool 136 from contact with the semiconductor wafer W. In some embodiments, the target area 108 is included within an area of contact of the tool 136 and the semiconductor wafer W determined by the position of the tool. In this case, for example, the target area 108 may show a reduction from the defect count 112 to the second defect count 116 resulting from application of the tool 136 to the target area 108. In some embodiments, the target area 108 is included within an area of contact of the tool 136 and the semiconductor wafer W determined by the position of the tool. In this case, for example, the target area 108 may show a reduction from the defect count 112 to the second defect count 116 resulting from application of the tool 136 to the target area 108.

At 102b and according to some embodiments, the target area 108 of the semiconductor wafer W is scanned by the light signal 110a over the target area 108 by the light source 138 and is detected by the reflected light signal 110b reflected from the target area 108 by the detector 140. In some embodiments, the light signal 110a includes at least one of: a discrete wavelength, a plurality of discrete wavelengths, or a range of wavelengths. In some embodiments, the range of wavelengths includes at least one of: infrared wavelengths, near infrared wavelengths, optical wavelengths, or ultraviolet wavelengths. In some embodiments, the detector 140 is configured as a photodiode array having a relative responsivity to the discrete wavelength, the plurality of discrete wavelengths, or the range of wavelengths. Relative responsivity, also known as spectral responsivity, may be expressed as a ratio of generated photocurrent to incident radiation power, expressed in Amps (A)/Watts (W). Relative responsivity may also be known as wavelength-dependence, and may be expressed as quantum efficiency or a ratio of a number of photo-generated carriers to incident photons, which is a dimensionless quantity. In some embodiments, relative responsivity may be normalized to clear at a wavelength of 256 nanometers (nm) and a temperature (T) of 25 degrees Celsius (° C.). In some embodiments, the light signal 110a may comprise optical wavelengths, also known as visible radiation, which may be narrowly set forth from about 420 nm to about 680 nm and may be broadly set forth from about 380 nm to about 800 nm. White radiation is generally a combination of all optical radiation. According to some embodiments, optical radiation comprises red radiation (e.g., generally a red range of wavelengths from about 620 nm to about 700 nm), green radiation (e.g., generally a green range of wavelengths from about 492 nm to about 577 nm), blue radiation (e.g., generally a blue range of wavelengths from about 455 nm to about 492 nm), and white radiation (e.g., generally a white range of wavelengths from about 380 nm to about 800 nm). In some embodiments, the light signal 110a may comprise infrared wavelengths, which may be set forth between about 700 nm and about 1000 nm. In some embodiments, the light signal 110a may comprise NIR wavelengths, which may be set forth as an NIR range of wavelengths from about 750 nm to about 1400 nm or may be set forth as an NIR range of wavelengths from about 780 nm to about 2500 nm. In some embodiments, the light signal 110a may comprise ultraviolet wavelengths, which may be set forth between about 10 nm and about 400 nm. Other arrangements and/or configurations of the scanning the light signal 110a and detecting the reflected light signal 110b are within the scope of the present disclosure.

At 102b and according to some embodiments, testing a test reflected light signal reflected from the target area in response to a test light signal may be performed. In some embodiments, a test light signal may be scanned to the surface 106 of the semiconductor wafer W and a test reflected light signal may be detected from the target area 108 in response to the test light signal. In some embodiments, the test light signal is scanned from the light source 138 and the test reflected light signal is detected by the detector 140. In this case, after detecting the test reflected light signal but before scanning the light signal 110a over the target area 108, at least one light signal parameter may be adjusted based on at least one of the recipe performed by the post-CMP at 102a or a recipe parameter. In some embodiments, the at least one light signal parameter includes: a wavelength of the light signal, an intensity of the light signal, an incident angle of the light signal relative to the semiconductor wafer W, an ON/OFF time of the light signal, the target area 108 on the surface of the semiconductor wafer W, etc. In some embodiments, the recipe parameter includes at least one of: a clean time for applying a tool to the surface of the semiconductor wafer, a clean range for applying the tool about the surface of the semiconductor wafer, a downforce for applying the tool to the surface of the semiconductor wafer, a rotational speed for rotating the tool during contact with the surface of the semiconductor wafer, or an inclined angle for applying the tool to the surface of the semiconductor wafer. In this case, quality of the light signal 110a and the reflected light signal 110b may be improved and accuracy of the defect count 112 may be improved.

According to some embodiments, 102b may be performed before 102a. For example, the light signal 110a may be scanned to the surface 106 of the semiconductor wafer W and the reflected light signal 110b may be detected from the target area 108 before post-CMP at 102a. In this case, after detecting the reflected light signal 110b but before working the semiconductor wafer W with the tool 136, at least one of the recipe performed by the post-CMP at 102a or a recipe parameter may be adjusted. For example, the recipe may be adjusted to initially work the target area 108 or a portion of the surface 106 including the target area 108 with the tool 136 twice based upon the defect count 112 exceeding the threshold TH. Multiple target areas with defect counts exceeding the threshold TH may be detected, and the recipe may be adjusted to initially work the multiple target areas with defect counts exceeding the threshold TH. In some embodiments, the recipe parameter includes at least one of: a clean time for applying a tool to the surface of the semiconductor wafer, a clean range for applying the tool about the surface of the semiconductor wafer, a downforce for applying the tool to the surface of the semiconductor wafer, a rotational speed for rotating the tool during contact with the surface of the semiconductor wafer, or an inclined angle for applying the tool to the surface of the semiconductor wafer. In this case, initial post-CMP by the tool 136 at 102a may be improved.

At 102c and according to some embodiments, the second post-CMP may be performed, in-situ and within the post-CMP chamber 104, on the surface 106 of the semiconductor wafer W responsive to the defect count 112 exceeding the threshold TH. For example, the second post-CMP may not include adjustment of recipe parameters during the second post-CMP. In some embodiments, the second post-CMP may be performed on the target area 108 of the surface 106 of the semiconductor wafer W. In some embodiments, the second post-CMP may be performed on a portion of the surface 106 of the semiconductor wafer W including the target area 108. In some embodiments, the second post-CMP may include adjusting at least one recipe parameter of the recipe responsive to the defect count 112 exceeding the threshold TH. For example, the adjusted parameter may include a rotational speed of the tool 136, a force of the tool 136 applied to the surface 106 of the semiconductor wafer W, and/or a time of application of the tool 136 to the surface 106 of the semiconductor wafer W. In some embodiments, the second post-CMP is performed with the at least one adjusted recipe parameter on the target area 108 of the surface 106 of the semiconductor wafer W. In some embodiments, the second post-CMP is performed with the at least one adjusted recipe parameter on a surface of a second semiconductor wafer (not shown) within the post-CMP chamber 104. In this case and for example, the second semiconductor wafer is worked with the at least one adjusted recipe parameter to improve processing thereof and reduce a defect count of the second semiconductor wafer. In some embodiments, the second post-CMP, at 102c, is performed with a second recipe different than the recipe of the post-CMP at 102a. For example, the recipe of the post-CMP at 102a may include applying the tool 136 in contact with the semiconductor wafer W at a first position, and continuing to apply the tool 136 from the first position to a second position while in contact with the semiconductor wafer W. In this case and for example, the second recipe may include applying the tool 136 in contact with the semiconductor wafer W at a first position, removing the tool 136 from contact with the semiconductor wafer W, re-positioning the tool 136 from the first position to the second position, and then applying the tool 136 in contact with the semiconductor wafer W at the second position. Other arrangements and/or configurations for the second post-CMP are within the scope of the present disclosure.

With reference to FIG. 1B and according to some embodiments, scanning is performed, in-situ and within the post-CMP chamber 104, with the light signal 110a over the target area 108 of the surface 106 of the semiconductor wafer W. Detecting is performed, in-situ and within the post-CMP chamber 104, with the reflected light signal 110b reflected from the target area 108. In some embodiments, the light signal 110a is scanned at an incident angle 142 relative to the surface 106 of the semiconductor wafer W, and the reflected light signal 110b is detected at a reflected angle 144 relative to the surface 106 of the semiconductor wafer W. In some embodiments, the incident angle 142 is the same as the reflected angle 144. In some embodiments, the incident angle 142 and/or the reflected angle 144 may be 15°, 30°, 45°, 60°, or 75°. In some embodiments, the incident angle 142 and/or the reflected angle 144 may be about 0° or 90°. In some embodiments, the incident angle 142 and/or the reflected angle 144 may be adjusted within a range of angles in response to detects present on the surface 106 of the semiconductor wafer W. In some embodiments, the cavity 132 may be present as a scratch, a hone, a pit, etc. on a surface of the semiconductor wafer W. In some embodiments, the cavity 132 may result from dropping the semiconductor wafer W and/or contact of an external object with the surface of the semiconductor wafer W. In some embodiments, the protrusion 134 may comprise surface material on the surface of the semiconductor wafer W during formation of the cavity 132. For example, the protrusion 134 may be more readily detected with the incident angle 142 and/or the reflected angle 144 at an angle of 15°, 30°, 45°, or a range about 15°, 30°, 45° (e.g., 10-20°, 25-35°, 40-50°). For example, the cavity 132 may be more readily detected with the incident angle 142 and/or the reflected angle 144 at an angle of 45°, 60°, 75°, or a range about 45°, 60°, 75° (e.g., 40-50°, 55-65°, 70-80°). In some embodiments, the incident angle 142 is different than the reflected angle 144, such as greater than or less than the reflected angle 144. In some embodiments, the incident angle 142 and/or the reflected angle 144 may be adjusted by repositioning the light source 138 or the detector 140 within the post-CMP chamber 104. For example, the light source 138 and/or the detector 140 may be connected to an interior wall 146 of the post-CMP chamber with an adjustable bracket (not shown). For example, the light source 138 and/or the detector 140 may be connected to an interior wall 146 of the post-CMP chamber along an adjustable track (not shown). In some embodiments, the incident angle 142 and/or the reflected angle 144 may be adjusted by repositioning a component of the light source 138 or a component of the detector 140, described in greater detail herein. In some embodiments, the incident angle 142 and/or the reflected angle 144 may be adjusted by repositioning the light source 138, a component of the light source 138, the detector 140, and/or a component of the detector 140. Other arrangements and/or configurations for positioning and/or adjusting the incident angle 142 and/or the reflected angle 144 are within the scope of the present disclosure.

With reference to FIG. 1C and according to some embodiments, scanning is performed, in-situ and within a post-CMP chamber 150, with a second light signal 152a over the target area 108 of the surface 106 of the semiconductor wafer W.

Detecting is performed, in-situ and within the post-CMP chamber 150, with a second reflected light signal 152b reflected from the target area 108. In some embodiments, the second light signal 152a is scanned at a second incident angle 154 relative to the surface 106 of the semiconductor wafer W with a second light source 156, and the second reflected light signal 152b is detected at a second reflected angle 158 relative to the surface 106 of the semiconductor wafer W with a second detector 159. In some embodiments, the second incident angle 154 is the same as the second reflected angle 158. In some embodiments, the second incident angle 154 and/or the second reflected angle 158 may be 15°, 30°, 45°, 60°, or 75°. In some embodiments, the second incident angle 154 and/or the second reflected angle 158 may be about 0° or 90°. For example, the protrusion 134 may be more readily detected with the second incident angle 154 and/or the second reflected angle 158 at an angle of 15°, 30°, 45°, or a range about 15°, 30°, 45° (e.g., 10-20°, 25-35°, 40-50°). For example, the cavity 132 may be more readily detected with the second incident angle 154 and/or the second reflected angle 158 at an angle of 45°, 60°, 75°, or a range about 45°, 60°, 75° (e.g., 40-50°, 55-65°, 70-80°). In some embodiments, the second incident angle 154 and/or the second reflected angle 158 may be adjusted within a range of angles in response to detects present on the surface 106 of the semiconductor wafer W. For example, the second incident angle 154 and/or the second reflected angle 158 may be adjusted to 30° to detect the protrusion 134. For example, the second incident angle 154 and/or the second reflected angle 158 may be adjusted to 60° to detect the cavity 132. In some embodiments, scanning and detection are performed while a tool 160 is removed from obstruction of the second light signal 152a and/or the second reflected light signal 152b. In some embodiments, the post-CMP chamber 150 is the same as the post-CMP chamber 104. In some embodiments, the post-CMP chamber 150 is different than the post-CMP chamber 104. In some embodiments, the post-CMP chamber 150 is part of a different post-CMP apparatus than the post-CMP chamber 104, and the tool 160 is a different post-CMP tool than the tool 136. In some embodiments, the second light source 156 is the same as the light source 138, but positioned at a different incident angle (e.g., the second incident angle 154 is different from the incident angle 142). In some embodiments, the second light signal 152a has the same wavelength as the light signal 110a, but positioned at a different incident angle (e.g., the second incident angle 154 is different from the incident angle 142). In some embodiments, the second light signal 152a has a wavelength from the light signal 110a. Other arrangements and/or configurations of the second light signal 152a, the second reflected light signal 152b, the second incident angle 154, and/or the second reflected angle 158 are within the scope of the present disclosure.

Figure 1D:
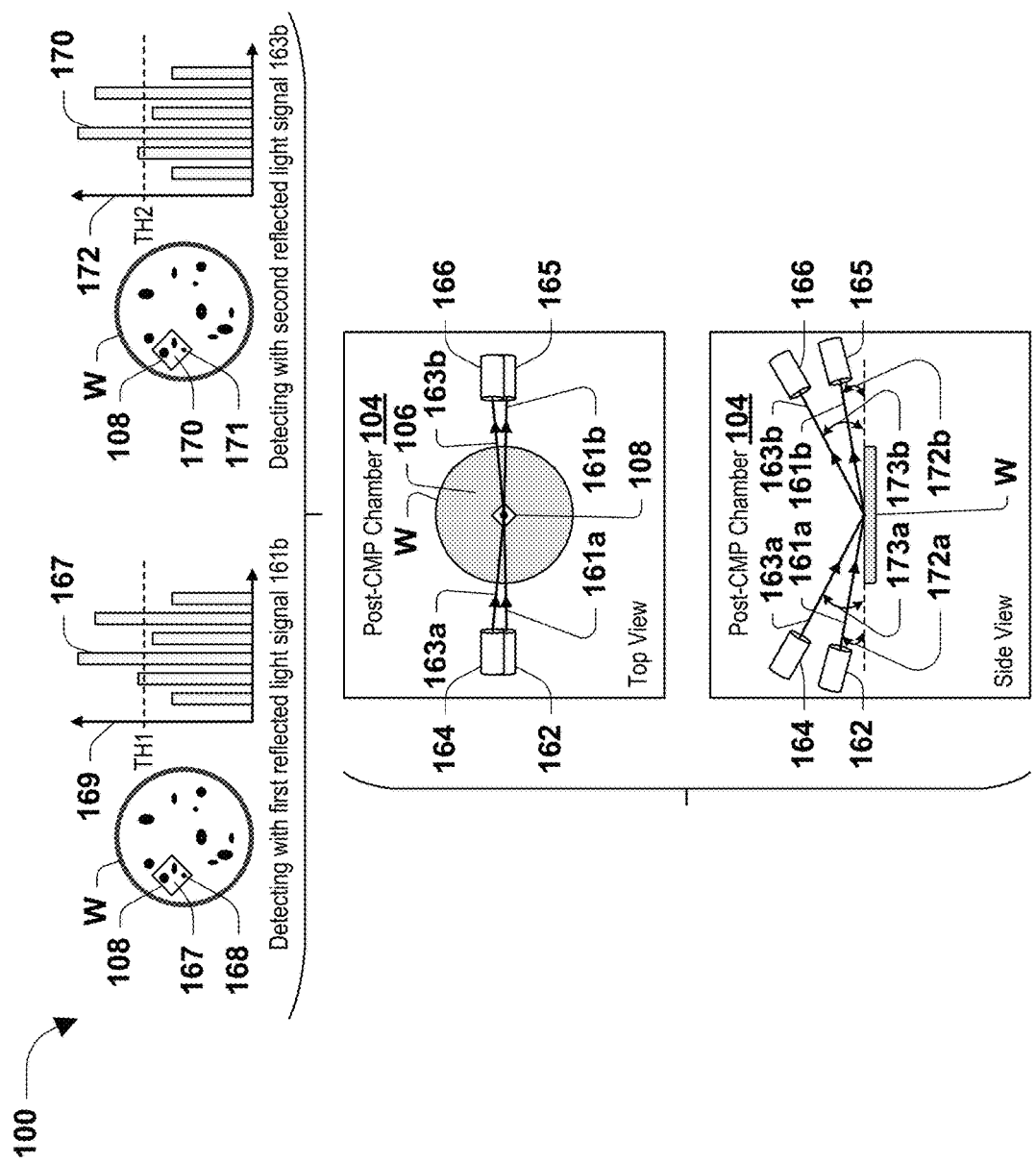

With reference to FIG. 1D and according to some embodiments, scanning is performed, in-situ and within the post-CMP chamber 104 over the target area 108 of the semiconductor wafer W. Scanning is performed with a first light signal 161a by a first light source 162 and with a second light signal 163a by a second light source 164. Detecting is performed, in-situ and within the post-CMP chamber 104, of the target area 108 based on reflections of the first light signal 161a and the second light signal 163a. Detecting is performed with a first reflected light signal 161b by a first detector 165 and with a second reflected light signal 163b by a second detector 166. In some embodiments, a first defect count 167 of first defects 168 present in the target area 108 is determined based on the first reflected light signal 161b reflected from the target area 108. The first defect count 167 may be compared with a first threshold TH1 as illustrated by a first graph 169. A second defect count 170 of second defects 171 present in the target area 108 is determined based on the second reflected light signal 163b reflected from the target area 108. The second defect count 170 may be compared with a second threshold TH2 as illustrated by a second graph 172. In some embodiments, the first threshold TH1 is equal to the second threshold TH2. In some embodiments, the first threshold TH1 is different than the second threshold TH2, such as greater than or less than the second threshold TH2. According to some embodiments, a total defect count of defects present in the target area 108 is based on the first reflected light signal 161b reflected from the target area 108 and the second reflected light signal 163b reflected from the target area 108. For example, the total defect count may be based on an average of the first defect count 167 detected by the first detector 165 and the second defect count 170 detected by the second detector 166. According to some embodiments, the total defect count may be based on the type of defects. For example, the first defect count 167 and the second defect count 170 may correspond to a type of defect, such as the particle 128, the residue 130, the cavity 132, or the protrusion 134. According to some embodiments, the total defect count may be based on the size of defects. For example, the first defect count 167 and the second defect count 170 may correspond to a first size of defect, a second size of defect, or another size of defect.

According to some embodiments, the first reflected light signal 161b has a first wavelength and the second reflected light signal 163b has a second wavelength. In some embodiments, the second wavelength is different than the first wavelength. In some embodiments, the first reflected light signal 161b is a discrete wavelength, a plurality of discrete wavelengths, or a range of wavelengths, as set forth herein. In some embodiments, the second reflected light signal 163b is a discrete wavelength, a plurality of discrete wavelengths, or a range of wavelengths, different from the first reflected light signal 161b. In some embodiments, the range of wavelengths of the first reflected light signal 161b and/or the second reflected light signal 163b includes at least one of: infrared wavelengths, near infrared (NIR) wavelengths, optical wavelengths, or ultraviolet wavelengths. In some embodiments, the first light signal 161a and the second light signal 163a are scanned at the same time and the first reflected light signal 161b and the second reflected light signal 163b are detected at the same time. In some embodiments, the first light signal 161a and the second light signal 163a are scanned at different times, and the first reflected light signal 161b and the second reflected light signal 163b are detected at different times.

According to some embodiments, the first light signal 161a is scanned at a first incident angle 172a relative to the surface 106 of the semiconductor wafer W, and the second light signal 163a is scanned at a second incident angle 173a relative to the surface 106 of the semiconductor wafer W. In some embodiments, the first reflected light signal 161b is detected at a first reflected angle 172b relative to the surface 106 of the semiconductor wafer W, and the second reflected light signal 163b is detected at a second reflected angle 173b relative to the surface 106 of the semiconductor wafer W. In some embodiments, the first incident angle 172a is the same as the second incident angle 173a. In some embodiments, the first incident angle 172a is different from the second incident angle 173a, such as greater than or less than the second incident angle 173a. In some embodiments, the first reflected angle 172b is the same as the second reflected angle 173*b*. In some embodiments, the first reflected angle 172*b* is different from the second reflected angle 173*b*, such as greater than or less than the second reflected angle 173*b*. Other arrangements and/or configurations for determining the first defect count 167, the second defect count 170, and/or a total defect count are within the scope of the present disclosure.

With reference to FIG. 1E and according to some embodiments, scanning is performed, in-situ and within the post-CMP chamber 104 over the semiconductor wafer W. Scanning is performed with a first light signal 174*a*1 by a first light source 175-1, with a second light signal 174*a*2 by a second light source 175-2, and with a third light signal 174*a*3 by a third light source 175-3. Detecting is performed, in-situ and within the post-CMP chamber 104, of the semiconductor wafer W based on reflections of the light signals 174*a*1-*a*3. Detecting is performed with a first reflected light signal 174*b*1 by a first detector 176-1, with a second reflected light signal 174*b*2 by a second detector 176-2, and with a third reflected light signal 174*b*3 by a third detector 176-3. According to some embodiments, the light sources 175-1, 175-2, 175-3 scan the target area 108 of the semiconductor wafer W with the light signals 174*a*1, 174*a*2, 174*a*3. In this case, defect counts may be determined from the reflected light signals 174*b*1, 174*b*2, 174*b*3 respectively detected by the detectors 176-1, 176-2, 176-3. A total defect count of the target area 108 may then be determined as set forth above with reference to FIG. 1D. In some embodiments, each of the light sources 175-1, 175-2, 175-3 scan a zone of the target area 108 of the semiconductor wafer W and each detector 176-1, 176-2, 176-3 detects a defect count for each zone. In this case, a total defect count of the target area 108 may be determined by adding the defect counts from each of the reflected light signals 174*b*1, 174*b*2, 174*b*3 respectively detected by the detectors 176-1, 176-2, 176-3. Other arrangements and/or configurations for determining the total defect count of the target area 108 are within the scope of the present disclosure.

With reference to FIG. 1F and according to some embodiments, scanning is performed, in-situ and within the post-CMP chamber 104 over the semiconductor wafer W. Scanning is performed with a first light signal 177*a*1 by a first light source 178-1, with a second light signal 177*a*2 by a second light source 178-2, with a third light signal 177*a*3 by a third light source 178-3, with a fourth light signal 177*a*4 by a fourth light source 178-4, with a fifth light signal 177*a*5 by a fifth light source 178-5, and with a sixth light signal 177*a*6 by a sixth light source 178-6. Detecting is performed, in-situ and within the post-CMP chamber 104, of the semiconductor wafer W based on reflections of the light signals 177*a*1-*a*6. Detecting is performed with a first reflected light signal 177*b*1 by a first detector 179-1, with a second reflected light signal 177*b*2 by a second detector 179-2, with a third reflected light signal 177*b*3 by a third detector 179-3, with a fourth reflected light signal 177*b*4 by a fourth detector 179-4, with a fifth reflected light signal 177*b*5 by a fifth detector 179-5, with a sixth reflected light signal 177*b*6 by a sixth detector 179-6. According to some embodiments, the light sources 178-1 to 178-6 scan the target area 108 of the semiconductor wafer W with the light signals 177*a*1 to 177*a*6. In this case, defect counts may be determined from the reflected light signals 177*b*1 to 177*b*6 respectively detected by the detectors 179-1 to 176-6. A total defect count of the target area 108 may then be determined as set forth above with reference to FIG. 1D. In some embodiments, each of the light sources 178-1 to 178-6 scan a zone of the target area 108 of the semiconductor wafer W and each detector 179-1 to 179-6 detects a defect count for each zone. In this case, a total defect count of the target area 108 may be determined by adding the defect counts from each of the reflected light signals 177*b*1-*b*6 respectively detected by the detectors 179-1 to 179-6.

According to some embodiments, groups of light sources and groups of detectors may cooperate at the same time and/or with the same wavelength for the lights signals and the reflected light signals to determine the defect count of the target area 108. For example, a first group of the light sources 178-1 and 178-2, which may be coincident in a vertical plane of the post-CMP chamber 104, may scan the target area 108 with a first wavelength, a second group of the light sources 178-3 and 178-4, which may be coincident in a vertical plane of the post-CMP chamber 104, may scan the target area 108 with a second wavelength, and a third group of the light sources 178-5 and 178-6, which may be coincident in a vertical plane of the post-CMP chamber 104, may scan the target area 108 with a third wavelength. In this case, a first group of the detectors 179-1 and 179-2, which may be coincident in a vertical plane of the post-CMP chamber 104, may detect the target area 108 with the first wavelength, a second group of the detectors 179-3 and 179-4, which may be coincident in a vertical plane of the post-CMP chamber 104, may detect the target area with the second wavelength, and a third group of the detectors 179-5 and 179-6, which may be coincident in a vertical plane of the post-CMP chamber 104, may detect the target area 108 with the third wavelength.

In another example, a first group of the light sources 178-1, 178-3, 178-5, which may be coincident in a horizontal plane of the post-CMP chamber 104, may scan the target area 108 with a first wavelength, and a second group of the light sources 178-2, 178-4, 178-6, which may be coincident in a horizontal plane of the post-CMP chamber 104, may scan the target area 108 with a second wavelength. In this case, a first group of the detectors 179-1, 179-3, 179-5, which may be coincident in a horizontal plane of the post-CMP chamber 104, may detect the target area 108 with the first wavelength, and a second group of the detectors 179-2, 179-4, 179-6, which may be coincident in a horizontal plane of the post-CMP chamber 104, may detect the target area 108 with the second wavelength. In some embodiments, groups of light sources and groups of detectors may cooperate at the same time to determine defect counts of zones the target area 108. In this case, the defect counts for each zone may be added to determine a total defect count for the target area 108. Other arrangements and/or configurations for determining the defect count of the target area 108 are within the scope of the present disclosure.

Figure 1G:
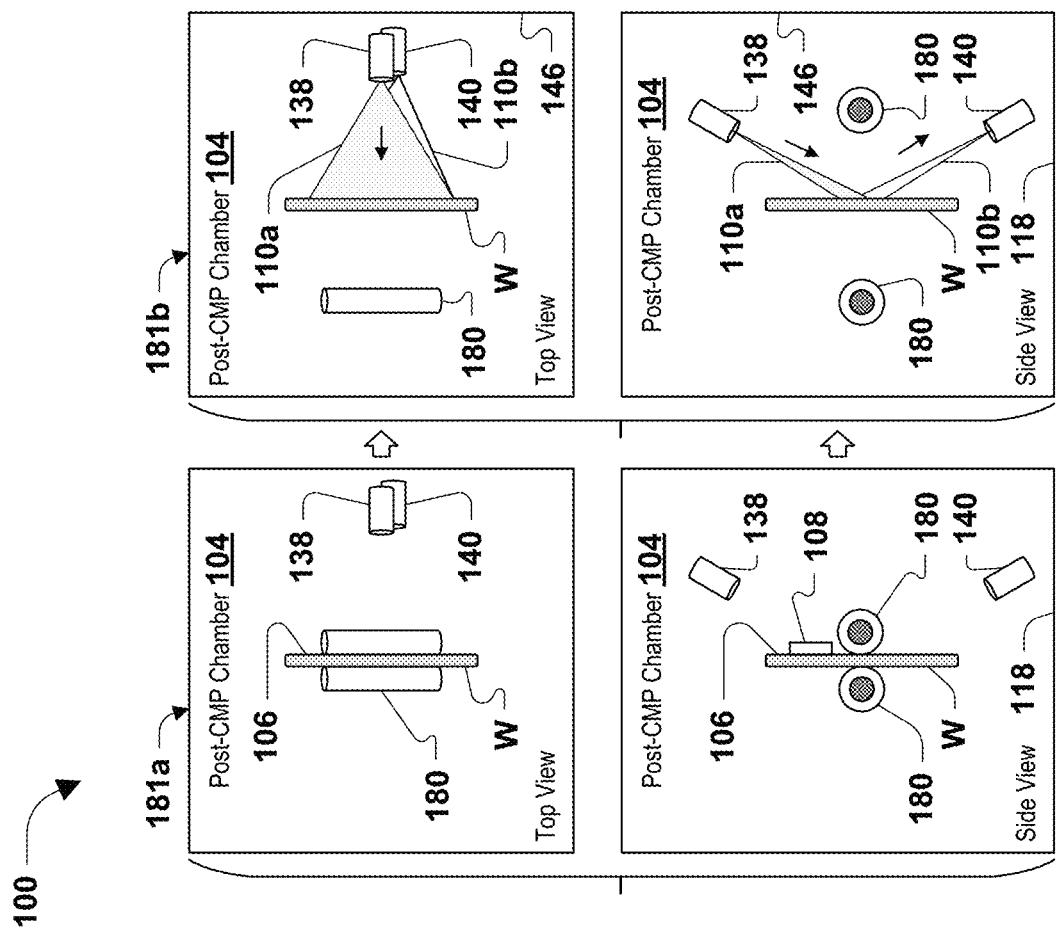

With reference to FIG. 1G and according to some embodiments, an implementation 100 is provided for vertical post-CMP. Scanning is performed, in-situ and within the post-CMP chamber 104, over the semiconductor wafer W, as set forth herein. Detecting is performed, in-situ and within the post-CMP chamber 104, as set forth herein. FIG. 1G illustrates an implementation 100 including a vertical post-CMP tool 180 within the post-CMP chamber 104. At 181*a*, vertical post-CMP is performed, in-situ within a post-CMP chamber 104 and according to a vertical post-CMP recipe, on the surface 106 of the semiconductor wafer W. The surface 106 of the semiconductor wafer W includes the target area 108. In some embodiments, the semiconductor wafer W is positioned within the post-CMP chamber 104 in a vertical orientation relative to the bottom surface 118 of the post-CMP chamber 104. The semiconductor wafer W is positioned such that the vertical post-CMP tool 180 may work the semiconductor wafer W such that particles, residue, and/or material removed from the surface 106 of the semiconductor wafer W is directed downward towards the bottom surface 118. In some embodiments, the vertical post-CMP tool 180 is a brush that performs brush mechanical scrubbing on the surface 106 of the semiconductor wafer W. The vertical post-CMP tool 180 (brush) may be formed of Polyvinyl Alcohol (PVA), Polyvinyl chloride (PVC), Benzotriazole (BTA), or the like. The vertical post-CMP tool 180 (brush) performs the brush mechanical scrubbing during cylindrical rotation of the brush orthogonal to the surface 106 of the semiconductor wafer W. At 181b, scanning is performed, in-situ and within the post-CMP chamber 104, with the light signal 110a over the target area 108. Before the scanning is performed at 181b, the vertical post-CMP tool 180 is moved horizontally away from the semiconductor wafer W to permit the light signal 110a and the reflected light signal 110b to transmit unobstructed through the post-CMP chamber 104. At 181b, the light source 138 is positioned for scanning the light signal 110a over the target area 108 based on the vertical orientation of the semiconductor wafer W relative to the bottom surface 118 of the post-CMP chamber 104. The detector 140 is positioned for detecting the reflected light signal 110b reflected from the target area 108 based on the vertical orientation of the semiconductor wafer W relative to the bottom surface 118 of the post-CMP chamber 104. For example, the light source 138 and/or the detector 140 may be connected to the interior wall 146 of the post-CMP chamber with an adjustable bracket (not shown) and/or along an adjustable track (not shown). Other arrangements and/or configurations of the vertical post-CMP tool 180 and vertical post-CMP are within the scope of the present disclosure.

Figure 1H:
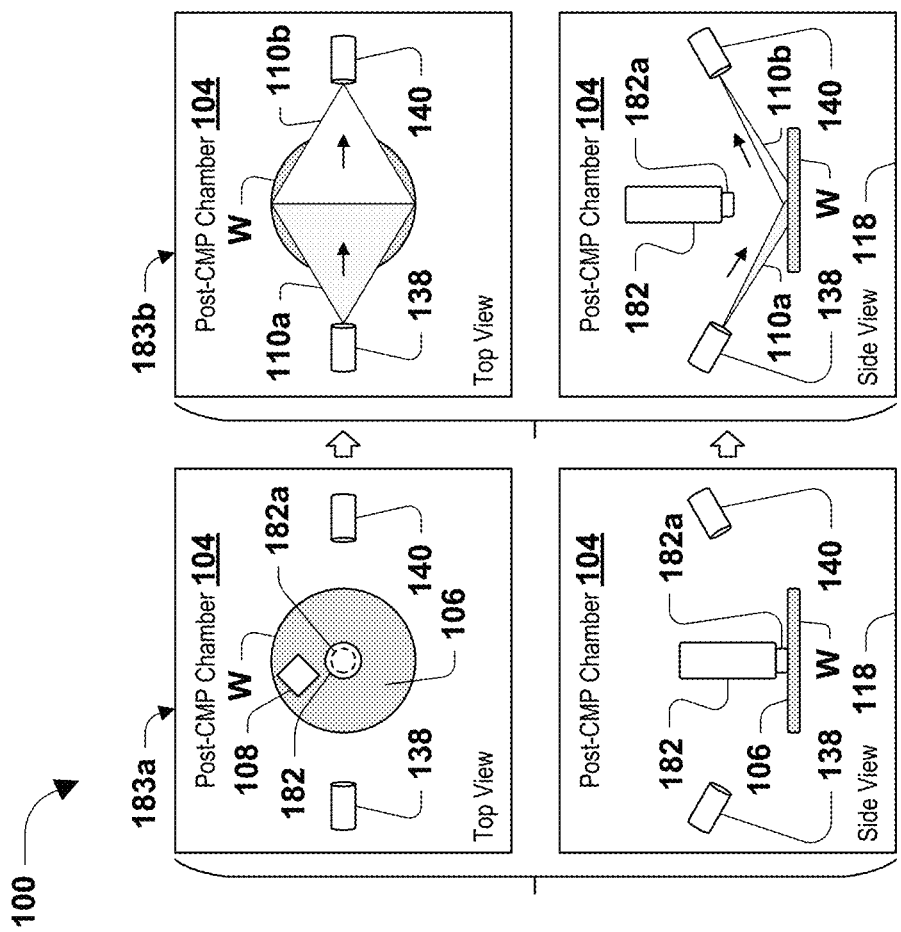

With reference to FIG. 1H and according to some embodiments, an implementation 100 is provided for pencil pad mechanical scrubbing. Scanning is performed, in-situ and within the post-CMP chamber 104, over the semiconductor wafer W, as set forth herein. Detecting is performed, in-situ and within the post-CMP chamber 104, as set forth herein. FIG. 1H illustrates an implementation 100 including a post-CMP tool 182 within the post-CMP chamber 104. In some embodiments, the post-CMP tool 182 is a pencil pad. At 183a, pencil pad mechanical scrubbing is performed on the semiconductor wafer W. In some embodiments, the pencil pad mechanical scrubbing is a post-CMP performed on the semiconductor wafer W according to a pencil pad recipe. In some embodiments, the pencil pad mechanical scrubbing includes mechanically scrubbing the surface 106 of the semiconductor wafer W with a pencil pad brush 182a during rotation of the post-CMP tool 182 (pencil pad) parallel to the surface 106 of the semiconductor wafer W. The pencil pad brush 182a may be formed of Polyvinyl Alcohol (PVA), Polyvinyl chloride (PVC), Benzotriazole (BTA), or the like. The surface 106 of the semiconductor wafer W includes the target area 108. In some embodiments, the semiconductor wafer W is positioned for the pencil pad mechanical scrubbing within the post-CMP chamber 104 in a horizontal orientation relative to the bottom surface 118 of the post-CMP chamber 104. At 183b, the light source 138 is positioned for scanning the light signal 110a over the target area 108 based on the horizontal orientation of the semiconductor wafer W relative to the bottom surface 118 of the post-CMP chamber 104. The detector 140 is positioned for detecting the reflected light signal 110b reflected from the target area 108 based on the horizontal orientation of the semiconductor wafer W relative to the bottom surface 118 of the post-CMP chamber 104. Other arrangements and/or configurations of the post-CMP tool 182 (pencil pad) are within the scope of the present disclosure.

With reference to FIG. 1I and according to some embodiments, an implementation 100 is provided for brush pad mechanical scrubbing. Scanning is performed, in-situ and within the post-CMP chamber 104, over the semiconductor wafer W, as set forth herein. Detecting is performed, in-situ and within the post-CMP chamber 104, as set forth herein. FIG. 1I illustrates an implementation 100 including a post-CMP tool 184 connected to a post-CMP tool component 184a within the post-CMP chamber 104. In some embodiments, the post-CMP tool 184 is configured as a brush pad. The brush pad may be formed of Polyvinyl Alcohol (PVA), Polyvinyl chloride (PVC), Benzotriazole (BTA), or the like. At 185a, brush pad mechanical scrubbing may be performed on the semiconductor wafer W. In some embodiments, the brush pad mechanical scrubbing is a post-CMP performed on the semiconductor wafer W according to a brush pad recipe. In some embodiments, the brush pad mechanical scrubbing includes mechanically scrubbing the surface 106 of the semiconductor wafer W with the post-CMP tool component 184a configured as a brush pad during rotation of the post-CMP tool 184 parallel to the surface 106 of the semiconductor wafer W. In some embodiments, the post-CMP tool 184 is configured as a sponge. At 185a, sponge mechanical scrubbing may be performed on the semiconductor wafer W. In some embodiments, the sponge mechanical scrubbing is a post-CMP performed on the semiconductor wafer W according to a sponge recipe. In some embodiments, the sponge mechanical scrubbing includes mechanically applying the sponge to the surface 106 of the semiconductor wafer W with the post-CMP tool component 184a configured as a sponge during rotation of the post-CMP tool 184 parallel to the surface 106 of the semiconductor wafer W. The surface 106 of the semiconductor wafer W includes the target area 108. In some embodiments, the semiconductor wafer W is positioned for the brush pad mechanical scrubbing or the sponge mechanical scrubbing within the post-CMP chamber 104 in a horizontal orientation relative to the bottom surface 118 of the post-CMP chamber 104. At 185b, the light source 138 is positioned for scanning the light signal 110a over the target area 108 based on the horizontal orientation of the semiconductor wafer W relative to the bottom surface 118 of the post-CMP chamber 104. The detector 140 is positioned for detecting the reflected light signal 110b reflected from the target area 108 based on the horizontal orientation of the semiconductor wafer W relative to the bottom surface 118 of the post-CMP chamber 104. Other arrangements and/or configurations of the post-CMP tool 184 configured as a brush pad or a sponge are within the scope of the present disclosure.

Figure 1J:
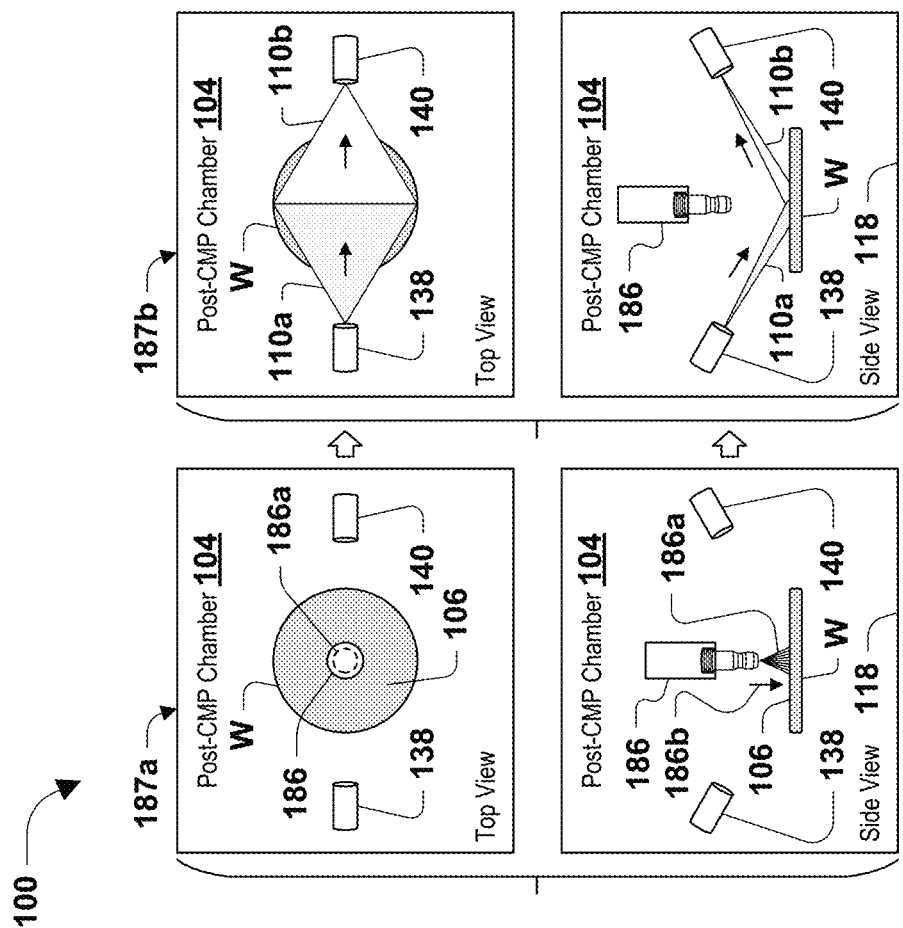

With reference to FIG. 1J and according to some embodiments, an implementation 100 is provided for spray application to the semiconductor wafer W. Scanning is performed, in-situ and within the post-CMP chamber 104, over the semiconductor wafer W, as set forth herein. Detecting is performed, in-situ and within the post-CMP chamber 104, as set forth herein. FIG. 1J illustrates an implementation 100 including post-CMP tool 186 configured as a spray applicator within the post-CMP chamber 104. At 187a, spray application is performed on the semiconductor wafer W. In some embodiments, the spray application is a post-CMP performed on the semiconductor wafer W according to a spray application recipe. In some embodiments, the spray application includes applying a spray 186a to the surface 106 of the semiconductor wafer W during rotation of semiconductor wafer W within the post-CMP chamber 104. In some embodiments, the detecting the reflected light signal 110*b* reflected from the target area 108 is performed before drying the spray 186*a* from the surface 106 of the semiconductor wafer W within the post-CMP chamber 104. In various embodiments, the spray 186*a* may comprise a non-reactive chemical spray, a water spray, a combination of a non-reactive chemical spray and a water spray, an air fluid spray, or another type of spray configured to remove defects from the surface 106 of the semiconductor wafer W. For example, the non-reactive chemical spray may include a chemical configured to remove the particle 128 and/or the residue 130 present on the surface 106 of the semiconductor wafer W resulting from CMP. In some embodiments a direction 186*b* of the spray 186*a* is perpendicular to the surface 106 of the semiconductor wafer W. In some embodiments a direction 186*b* of the spray 186*a* is at an angle to the surface 106 of the semiconductor wafer W, such as an acute angle or an obtuse angle. The surface 106 of the semiconductor wafer W includes the target area 108. In some embodiments, the semiconductor wafer W is positioned for the spray application within the post-CMP chamber 104 in a horizontal orientation relative to the bottom surface 118 of the post-CMP chamber 104. In some embodiments, the semiconductor wafer W is positioned for the spray application within the post-CMP chamber 104 at an angle relative to the bottom surface 118 of the post-CMP chamber 104, such as an acute angle or an obtuse angle. At 187*b* and in some embodiments, the light source 138 is positioned for scanning the light signal 110*a* over the target area 108 based on the horizontal orientation of the semiconductor wafer W relative to the bottom surface 118 of the post-CMP chamber 104. The detector 140 is positioned for detecting the reflected light signal 110*b* reflected from the target area 108 based on the horizontal orientation of the semiconductor wafer W relative to the bottom surface 118 of the post-CMP chamber 104. Other arrangements and/or configurations of the post-CMP tool 186 configured as a spray applicator are within the scope of the present disclosure.

Figure 2A:
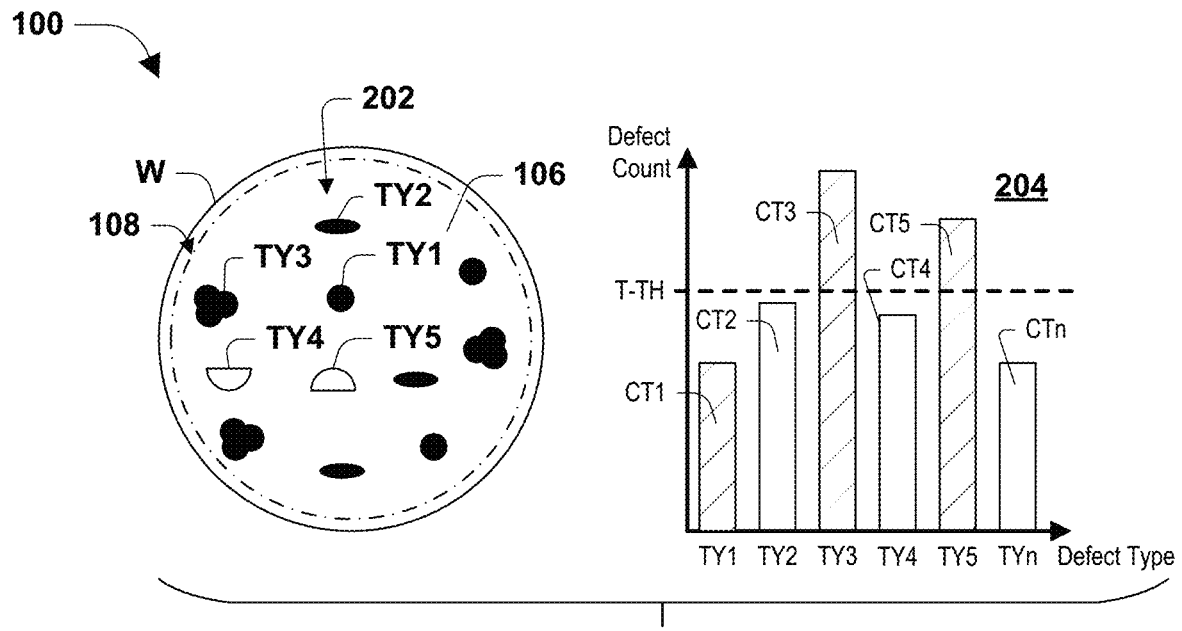
FIGS. 2A-2E illustrate an implementation of defect count detection of a semiconductor wafer, according to some embodiments.

FIGS. 2A-2E illustrate an implementation 100 of defect count detection of a semiconductor wafer W, according to some embodiments. With reference to FIG. 2A and according to some embodiments, the semiconductor wafer W is illustrated with a plurality of defects 202 disposed on the surface 106 and within the target area 108. In some embodiments, the plurality of defects 202 are scanned and detected as set forth herein. The plurality of defects 202 include various types, including a first type TY1, such as the particle 128; a second type TY2, such as the residue 130, a third type TY3, such as non-uniform particle; a fourth type TY4, such as the cavity 132, and a fifth type TY5, such as the protrusion 134. Scanning and detection of other types of defects 202, designated as type TYn are within the scope of the present disclosure. In some embodiments the particle 128 and/or the residue 130 are uniform, and in some embodiments the particle 128 and/or the residue 130 are non-uniform. According to some embodiments, the defects 202 are detected and counted as a defect count CT1, CT2, etc., according to type, as illustrated by graph 204. Each defect type, TY1, TY2, etc., is categorized, counted and compared to a threshold T-TH. In some embodiments, the defect count for each defect type is performed before post-CMP, such as set forth herein at 102*a*. In some embodiments, the defect count for each defect type is performed after post-CMP, such as set forth herein at 102*b* and 102*d*. In some embodiments, at least one recipe parameter of a post-CMP recipe is adjusted responsive to the defect count (e.g., CT1, CT2, etc.) of a defect type (e.g., TY1, TY2, etc.) exceeding the threshold T-TH. In some embodiments, a second post-CMP on the target area 108 of the surface 106 of the semiconductor wafer W is performed with at least one adjusted recipe parameter responsive to the defect count of a defect type exceeding the threshold T-TH. In some embodiments, the second post-CMP is performed on the surface 106 of the semiconductor wafer W within the post-CMP chamber 104. In some embodiments, the second post-CMP is performed on the surface 106 of the semiconductor wafer W within a second post-CMP chamber of a second post-CMP apparatus, as set forth herein. In some embodiments, the second post-CMP is performed on a surface of a second semiconductor wafer within the post-CMP chamber 104, as set forth herein.

Figure 2B:
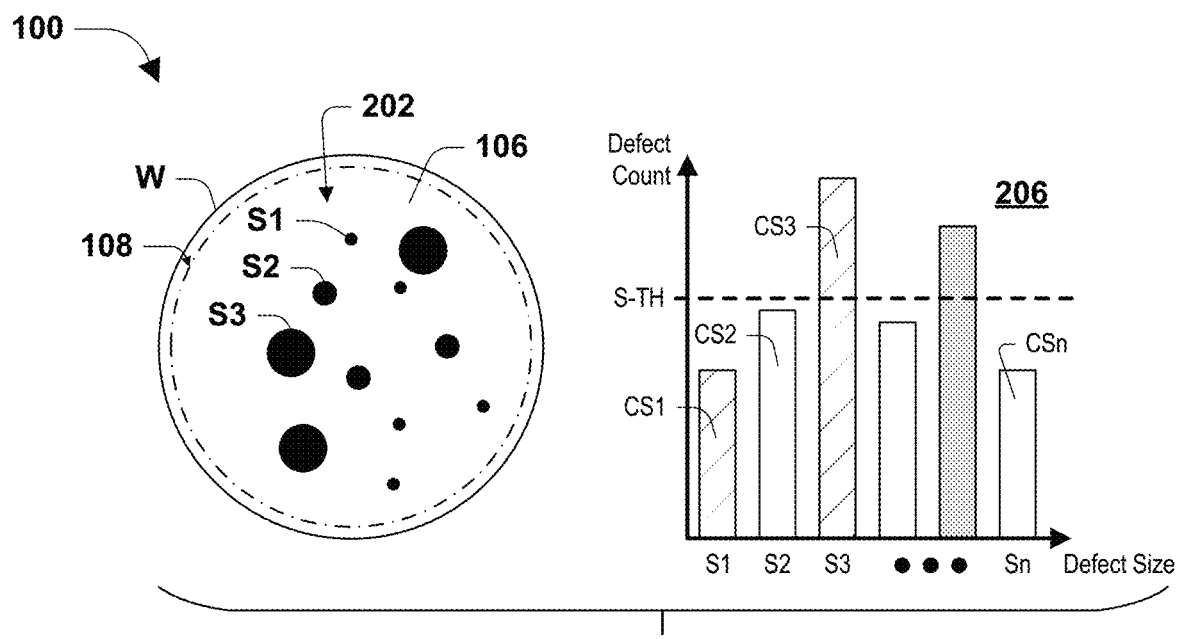

With reference to FIG. 2B and according to some embodiments, the semiconductor wafer W is illustrated with the plurality of defects 202 disposed on the surface 106 and within the target area 108. In some embodiments, the plurality of defects 202 include various sizes, including a first size S1, a second size S2, a third size S3, etc. Scanning and detection of other sizes of defects 202, designated as size Sn are within the scope of the present disclosure. According to some embodiments, the defects 202 are detected and counted as a defect count CS1, CS2, etc., according to size, as illustrated by graph 206. Each defect size, S1, S2, etc., is categorized, counted and compared to a threshold S-TH. In some embodiments, the defect count for each defect size is performed before post-CMP, such as set forth herein at 102*a*. In some embodiments, the defect count for each defect size is performed after post-CMP, such as set forth herein at 102*b* and 102*d*. In some embodiments, at least one recipe parameter of a post-CMP recipe is adjusted responsive to the defect count (e.g., CS1, CS2, etc.) of a defect size (e.g., S1, S2, etc.) exceeding the threshold S-TH. In some embodiments, a second post-CMP on the target area 108 of the surface 106 of the semiconductor wafer W is performed with at least one adjusted recipe parameter responsive to the defect count of a defect type exceeding the threshold S-TH. In some embodiments, the second post-CMP is performed on the surface 106 of the semiconductor wafer W within the post-CMP chamber 104. In some embodiments, the second post-CMP is performed on the surface 106 of the semiconductor wafer W within a second post-CMP chamber of a second post-CMP apparatus, as set forth herein. In some embodiments, the second post-CMP is performed on a surface of a second semiconductor wafer within the post-CMP chamber 104, as set forth herein.

Figure 2C:
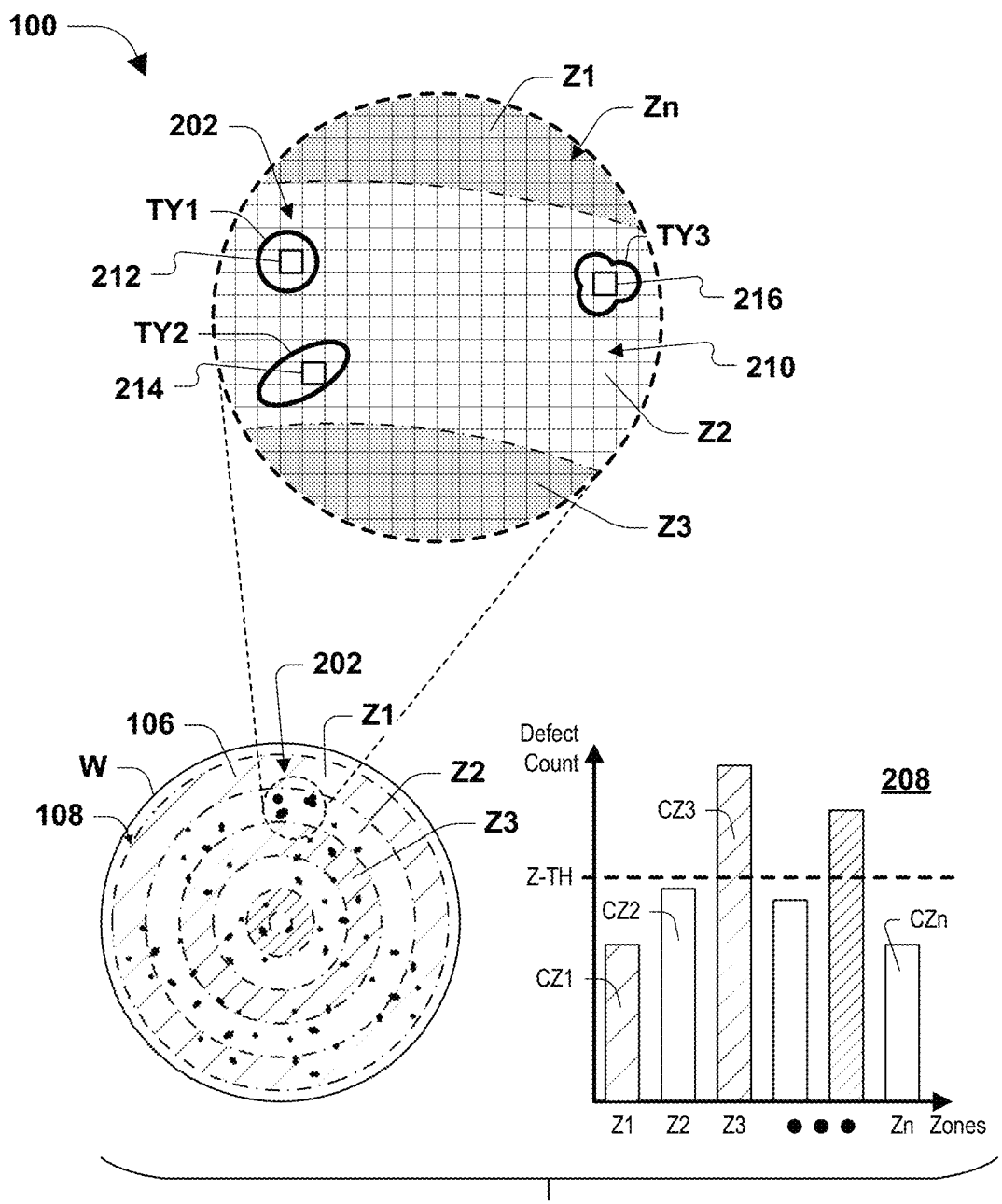

With reference to FIG. 2C and according to some embodiments, the semiconductor wafer W is illustrated with the plurality of defects 202 disposed on the surface 106 and within the target area 108. In some embodiments, a first post-CMP is performed, in-situ and according to a first recipe, on the surface 106 of the semiconductor wafer W within the post-CMP chamber 104. The light signal 110*a* is scanned, in-situ and within the post-CMP chamber 104, over the target area 108 of the surface 106 of the semiconductor wafer W. The target area 108 includes a plurality of zones Zn, such as a first zone Z1, a second zone Z3, a third zone Z3, etc. Scanning and detection of other zones, designated as Zn are within the scope of the present disclosure. The reflected light signal 110*b* is detected, in-situ and within the post-CMP chamber 104, from the plurality of zones Zn, including the first zone Z1, the second zone Z2, the third zone Z3, etc. A defect count CZ may be determined for each of the plurality of zones Zn based on a component of the reflected light signal 110*b*, as illustrated by graph 208. For example, a first defect count CZ1 may be determined for defects present in the first zone Z1 based on a first component of the reflected light signal 110b reflected from the first zone Z1. A second defect count CZ2 may be determined for defects present in the second zone Z2 based on a second component of the reflected light signal 110b reflected from the second zone Z2. A third defect count CZ3 may be determined for defects present in the third zone Z3 based on a third component of the reflected light signal 110b reflected from the third zone Z3, etc. According to some embodiments, the defects 202 are detected and counted as a defect count CZ1, CZ2, etc., according to zone, as illustrated by the graph 208. Each defect count CZ1, CZ2, etc., is categorized, counted and compared to a threshold Z-TH. In some embodiments, the defect count for each defect zone is performed before post-CMP, such as set forth herein at 102a. In some embodiments, the defect count for each defect zone is performed after post-CMP, such as set forth herein at 102b and 102d. In some embodiments, at least one recipe parameter of a post-CMP recipe is adjusted responsive to the defect count (e.g., CS1, CS2, etc.) of a defect zone (e.g., Z1, Z2, etc.) exceeding the threshold Z-TH.

According to some embodiments, the first recipe or a first recipe parameter of the first recipe is adjusted based on at least one defect counts corresponding to each of the plurality of zones Zn. For example, the first recipe or the first recipe parameter of the first recipe may be adjusted based on the first defect count CZ1 of the first zone Z1 or the second defect count CZ2 of the second zone Z2. In some embodiments, a second recipe of a second post-CMP or a second recipe parameter of the second recipe is adjusted based on based on at least one defect counts corresponding to each of the plurality of zones Zn. For example, the second recipe or the second recipe parameter of the second recipe may be adjusted based on the first defect count CZ1 of the first zone Z1 or the second defect count CZ2 of the second zone Z2. In some embodiments, the second post-CMP may be performed on the surface 106 of the semiconductor wafer W within a second post-CMP chamber, described in greater detail herein. The second post-CMP may be a brush mechanical scrubbing, a sponge mechanical scrubbing, a pencil pad mechanical scrubbing, a brush pad mechanical scrubbing, a spray application, or other type of post-CMP. The spray application may include applying a spray, including at least one of a non-reactive chemical spray or a water spray, to the surface of 106 the semiconductor wafer W within the post-CMP chamber 104, and detecting the reflected light signal 110b reflected from at least one of the plurality of zones, Zn, such as the first zone Z1, the second zone Z2, etc. In some embodiments, detecting the reflected light signal 110b is performed while the surface 106 of the semiconductor wafer W is wet after applying the spray 186a to the surface 106 of the semiconductor wafer W.

According to some embodiments, the detector 140 detects the reflected light signal 110b with a plurality of pixels 210 corresponding to resolution of the detector 140. For example, the plurality of pixels 210 may include first pixel 212 illustrated within a first type defect TY1, a second pixel 214 illustrated within a second type defect TY2, and a third pixel 216 illustrated within a third type defect TY3. In some embodiments a pixel size of the plurality of pixels 210 corresponds to a physical resolution of physical pixels detectable by the detector 140. In some embodiments, each the plurality of pixels 210 comprises a group of physical pixels and a size of each pixels group may be adjusted according to a size of the defect 126 to be detected. For example, the size of each pixel may be adjusted such that a pixel or a portion of the pixel is smaller than a defect size.

As illustrated, the size of the first pixel 212 is less than the size of the first type defect TY1, the size of the second pixel 214 is less than the size of the second type defect TY2, and the size of the third pixel 216 is less than the size of the third type defect TY3. In some embodiments, the size of each pixel may be adjusted such that the portion of the pixel is less than 50% of the defect size to be detected. In some embodiments, the size of each pixel group is adjusted after detecting a test reflected light signal reflected from the target area 108 in response to a test light signal. In this case, the size of each pixel group is a light signal parameter to be adjusted based on at least one of the recipe performed by the post-CMP on the surface 106 of the semiconductor wafer W or a recipe parameter.

According to some embodiments, each of the plurality of zones Zn may be a target area, such as the target area 108. In some embodiments, each of the plurality of zones Zn corresponds to a tool dimension, such as a dimension of the tool 136 for working the surface 106 of the semiconductor wafer W. For example, in the post-CMP tool 182 configured as a pencil pad of FIG. 1H, each of the plurality of zones Zn may correspond to a radius of contact of the pencil pad brush 182a about the surface 106 of the semiconductor wafer W. In the post-CMP tool 184 configured as a brush of FIG. 1I, each of the plurality of zones Zn may correspond to a radius of contact of the post-CMP tool component 184a configured as a brush pad about the surface 106 of the semiconductor wafer W. In the post-CMP tool 184 configured as a sponge of FIG. 1I, each of the plurality of zones Zn may correspond to a radius of contact of the post-CMP tool component 184a configured as a sponge about the surface 106 of the semiconductor wafer W. In the post-CMP tool 186 configured as a spray applicator of FIG. 1J, each of the plurality of zones Zn may correspond to a radius of application of the spray 186a about the surface 106 of the semiconductor wafer W. Other arrangements and/or configurations of the target area 108 and/or the plurality of zones Zn are within the scope of the present disclosure.

Figure 2D:
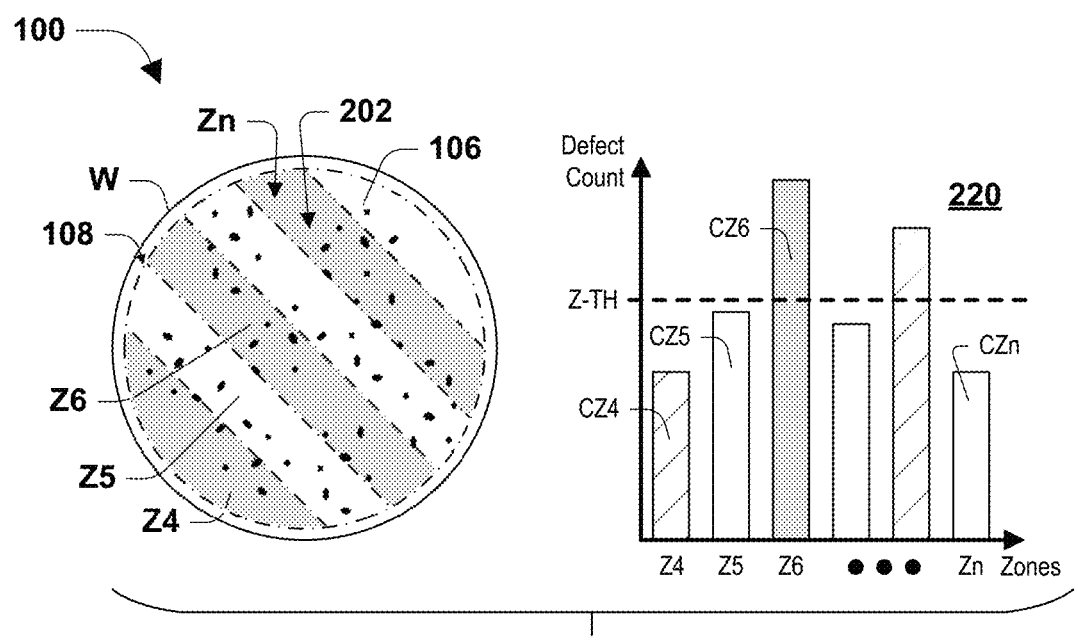

With reference to FIG. 2D and according to some embodiments, the semiconductor wafer W is illustrated with the plurality of defects 202 disposed on the surface 106 and within the target area 108. In some embodiments, post-CMP is performed, in-situ and according to a recipe, on the surface 106 of the semiconductor wafer W within the post-CMP chamber 104. The light signal 110a is scanned, in-situ and within the post-CMP chamber 104, over the target area 108 of the surface 106 of the semiconductor wafer W. The target area 108 includes a plurality of zones Zn, such as a fourth zone Z4, a fifth zone Z5, a sixth zone Z6, etc. Scanning and detection of other zones, designated as Zn are within the scope of the present disclosure. The reflected light signal 110b is detected, in-situ and within the post-CMP chamber 104, from the plurality of zones Zn, including zones Z4, Z5, Z6, etc. A defect count CZ may be determined for each of the plurality of zones Zn based on a component of the reflected light signal 110b, as illustrated by graph 220. For example, a fourth defect count CZ4 may be determined for defects present in the fourth zone Z4 based on a fourth component of the reflected light signal 110b reflected from the fourth zone Z4. A fifth defect count CZ5 may be determined for defects present in the fifth zone Z5 based on a fifth component of the reflected light signal 110b reflected from the fifth zone Z5. A sixth defect count CZ6 may be determined for defects present in the sixth zone Z6 based on a sixth component of the reflected light signal 110b reflected from the sixth zone Z6, etc.

According to some embodiments, each of the plurality of zones Zn may be a target area, such as the target area 108. In some embodiments, each of the plurality of zones Zn corresponds to a tool dimension, such as a dimension of the tool 136 for working the surface 106 of the semiconductor wafer W. As illustrated, the plurality of zones Zn are configured to correspond to a dimension of the tool 136 for laterally working across the surface 106 of the semiconductor wafer W. For example, in the post-CMP tool 184 configured as a brush of FIG. 1I, each of the plurality of zones Zn may correspond to a lateral zone of contact of the post-CMP tool component 184a configured as a brush pad about the surface 106 of the semiconductor wafer W. In the post-CMP tool 184 configured as a sponge of FIG. 1I, each of the plurality of zones Zn may correspond to a lateral zone of contact of the post-CMP tool component 184a configured as a sponge about the surface 106 of the semiconductor wafer W. In the post-CMP tool 186 configured as a spray applicator of FIG. 1J, each of the plurality of zones Zn may correspond to a lateral zone of application of the spray 186a about the surface 106 of the semiconductor wafer W. Other arrangements and/or configurations of the target area 108 and/or the plurality of zones Zn are within the scope of the present disclosure.

Figure 2E:
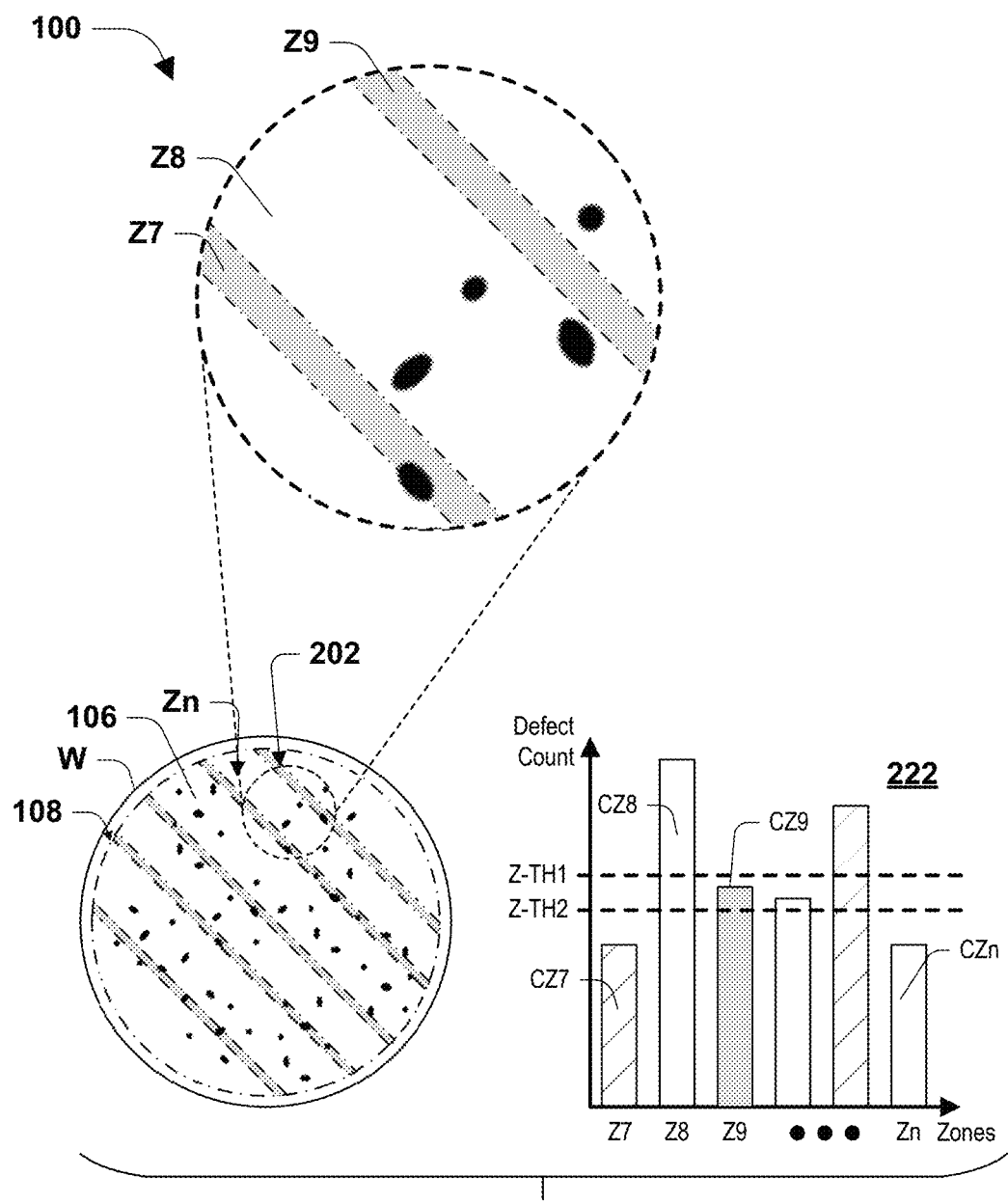

With reference to FIG. 2E and according to some embodiments, the semiconductor wafer W is illustrated with the plurality of defects 202 disposed on the surface 106 and within the target area 108. In some embodiments, post-CMP is performed, in-situ and according to a recipe, on the surface 106 of the semiconductor wafer W within the post-CMP chamber 104. The light signal 110a is scanned, in-situ and within the post-CMP chamber 104, over the target area 108 of the surface 106 of the semiconductor wafer W. The target area 108 includes a plurality of zones Zn, such as a seventh zone Z7, an eighth zone Z8, a ninth zone Z9, etc. Scanning and detection of other zones, designated as Zn are within the scope of the present disclosure. The reflected light signal 110b is detected, in-situ and within the post-CMP chamber 104, from the plurality of zones Zn, including zones Z7, Z8, Z9, etc. A defect count CZ may be determined for each of the plurality of zones Zn based on a component of the reflected light signal 110b, as illustrated by graph 222. For example, a seventh defect count CZ7 may be determined for defects present in the seventh zone Z7 based on a seventh component of the reflected light signal 110b reflected from the seventh zone Z4. An eighth defect count CZ8 may be determined for defects present in the eighth zone Z8 based on an eighth component of the reflected light signal 110b reflected from the eighth zone Z8. A ninth defect count CZ9 may be determined for defects present in the ninth zone Z9 based on a ninth component of the reflected light signal 110b reflected from the ninth zone Z9, etc.

According to some embodiments, each of the plurality of zones Zn may be a target area, such as the target area 108. In some embodiments, each of the plurality of zones Zn corresponds to a tool dimension, such as a dimension of the tool 136 for working the surface 106 of the semiconductor wafer W. According to some embodiments, the defects 202 are detected and counted as a defect count CZ7, CZ8, CZ9, etc., according to zone, as illustrated by the graph 222. Each defect count CZ7, CZ8, CZ9, etc., is categorized, counted and compared to a first threshold Z-TH1 or a second threshold Z-TH2. Each of the zones may have an associated type. For example, the seventh zone Z7 having a defect count CZ7 and the ninth zone Z9 having a defect count CZ9 may correspond to first type, which is a zone of impact of a periphery or edge of the tool 136. For example, the eight zone Z8 having a defect count CZ8 may correspond to a second type, which is a zone of impact of a body of the tool 136. In some embodiments, the first threshold Z-TH1 corresponds to the first type of zone and the second threshold Z-TH2 corresponds to the second type of zone. A defect count may be determined for each type of zone. For example, a defect count for the first type of zone may include the defect count CZ7 and the defect count CZ9. Other arrangements and/or configurations of the defect count for each zone and/or the defect count for each type zone of the plurality of zones Zn are within the scope of the present disclosure.

Figure 3A:
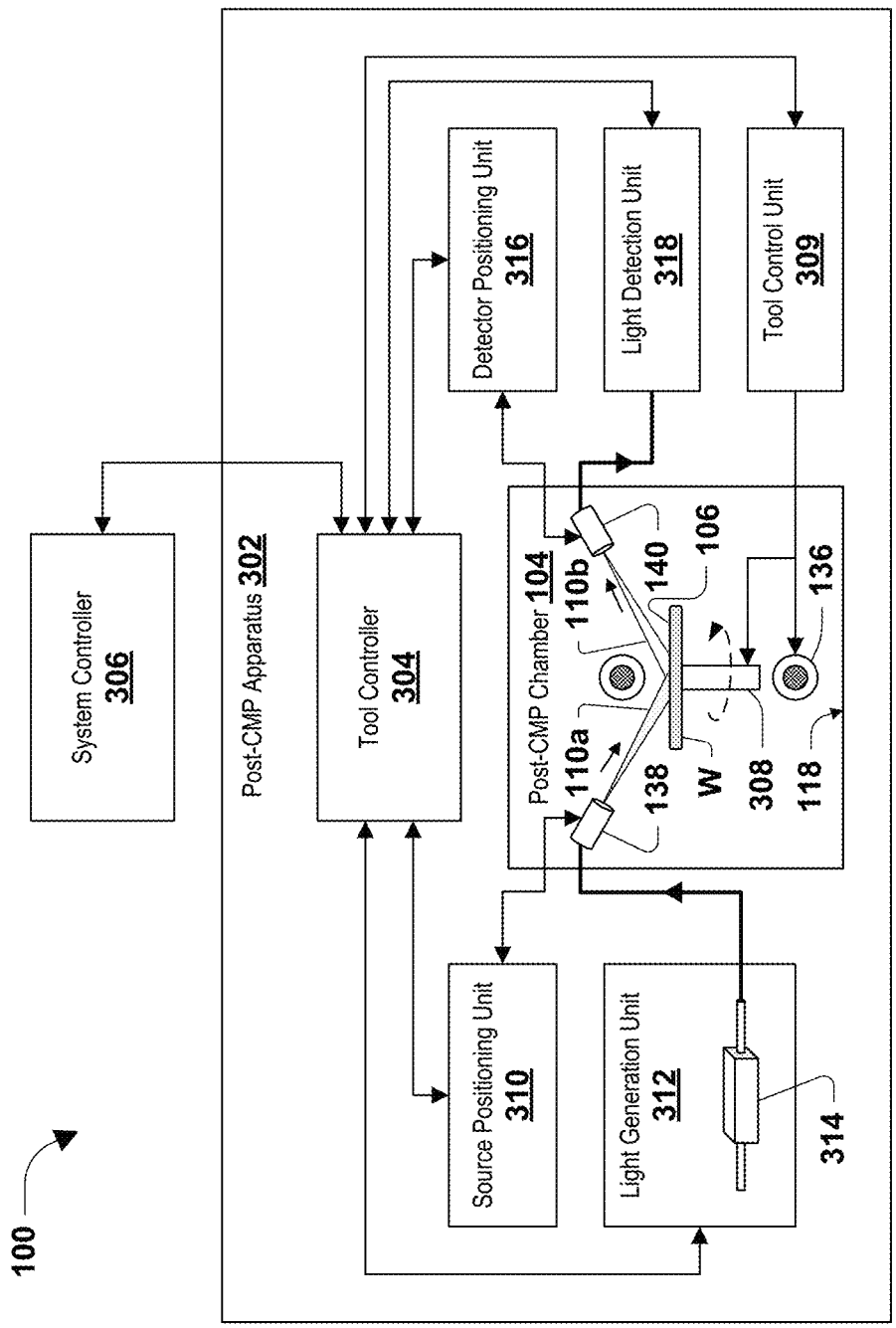
FIGS. 3A-3C illustrate an implementation of closed loop control in various post-CMP apparatuses, according to some embodiments.
Figure 3B:
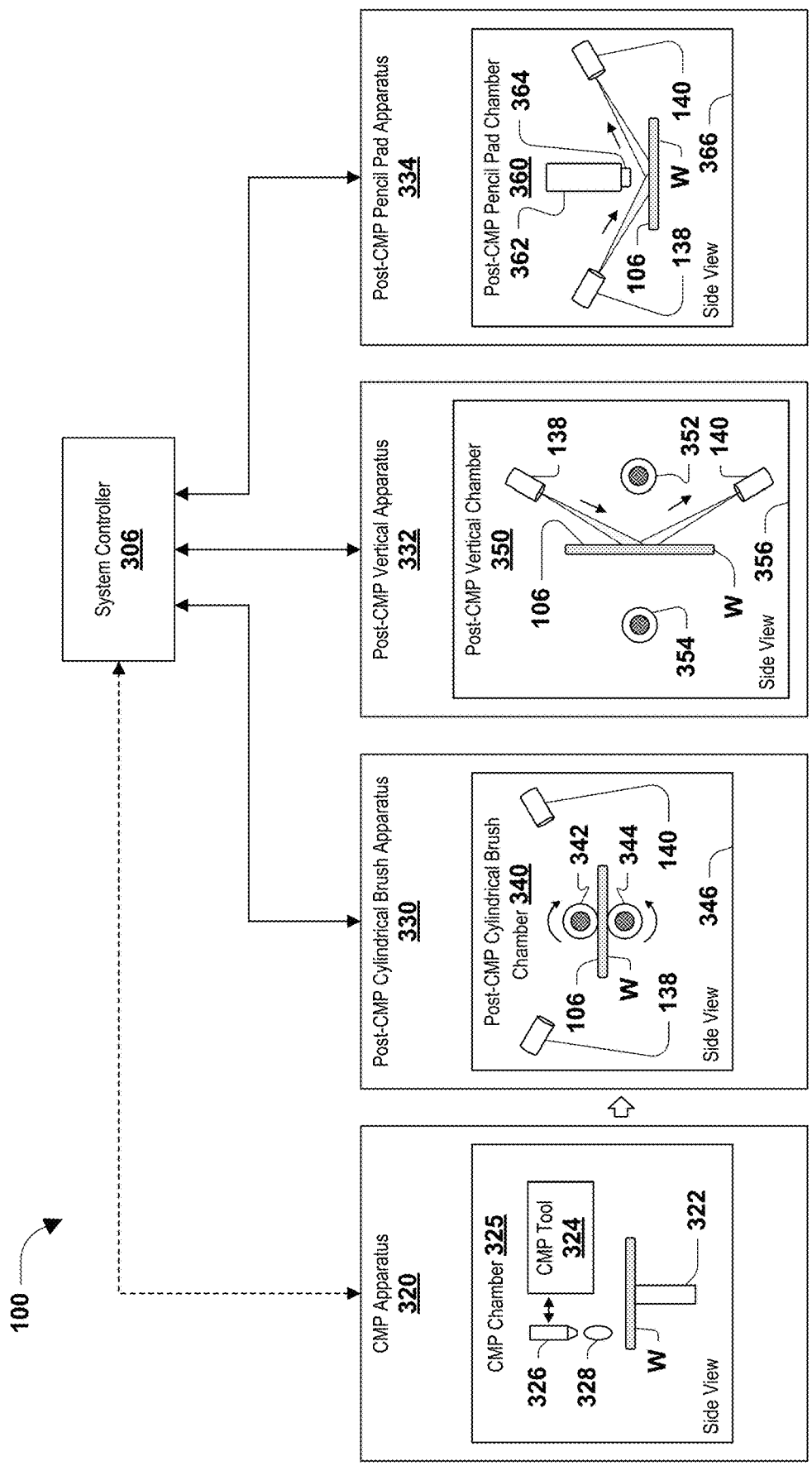
Figure 3C:
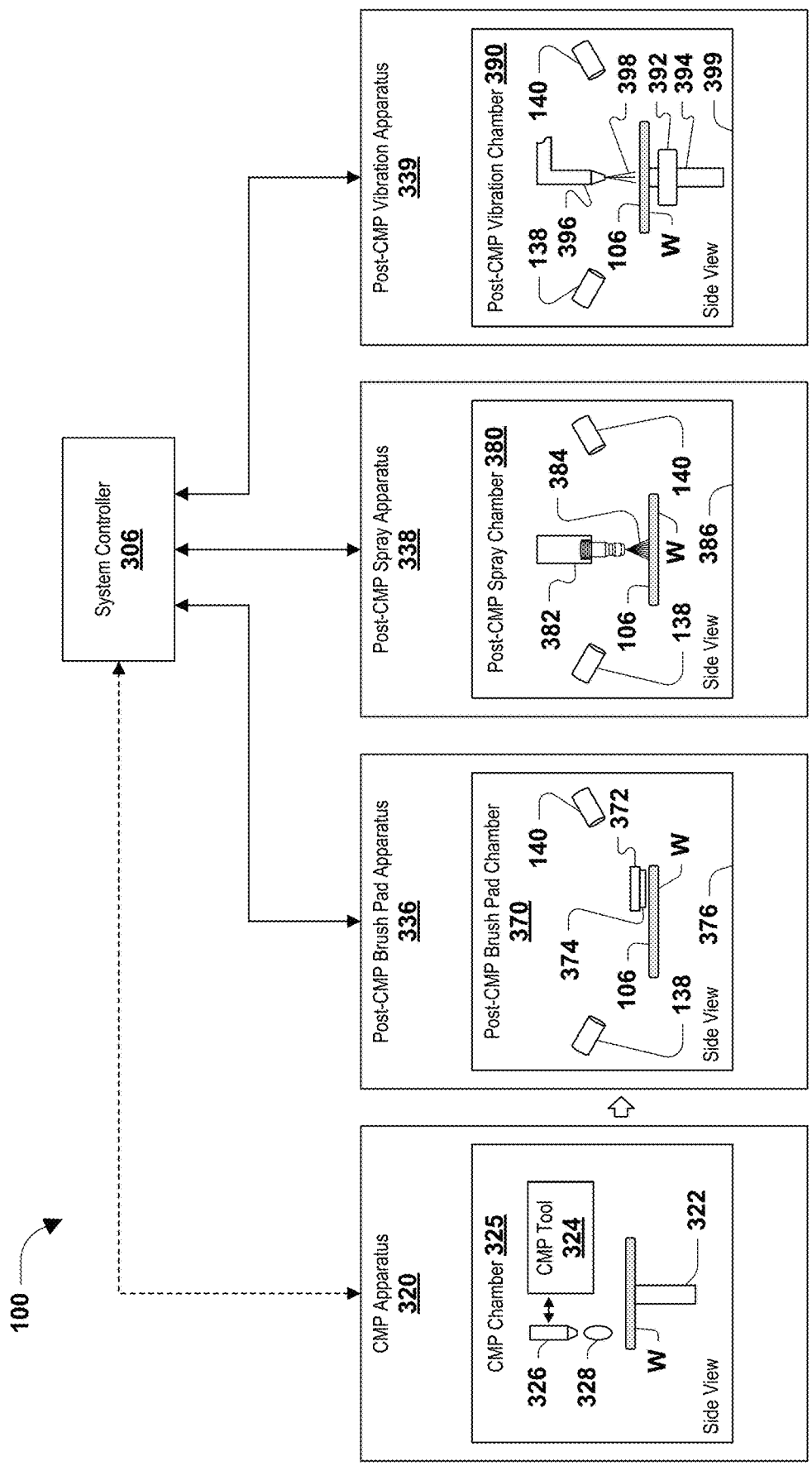

FIGS. 3A-3C illustrate an implementation 100 of closed loop control in various post-CMP apparatuses, according to some embodiments. According to some embodiments, each of the post-CMP apparatuses are configured to work post-CMP on the semiconductor wafer W set forth herein, such as with reference to the semiconductor wafer W illustrated in FIGS. 2A-2D. With reference to FIG. 3A and according to some embodiments, a post-CMP apparatus 302 includes the post-CMP chamber 104, which is configured to work the surface 106 of the semiconductor wafer W with the tool 136. The post-CMP apparatus 302 includes a tool controller 304 to control operation of the tool 136, scanning and detecting by the light source 138 and the detector 140, and to communication with a system controller 306. In some embodiments, the tool controller 304 and/or the system controller 306 includes a hardware device, such as an instance of the device 600 set forth herein with reference to FIG. 6. In some embodiments, the tool controller 304 controls the tool 136 by storing, implementing, changing and/or adjusting one or more recipes used by the tool 136 for working the surface 106 of the semiconductor wafer W. In some embodiments, the tool controller 304 controls the tool 136 by storing, implementing, changing and/or adjusting one or more recipe parameters used by the tool 136 to work the surface 106 of the semiconductor wafer W.

In some embodiments, the semiconductor wafer W is supported and retained within the post-CMP chamber 104 by a stage 308. In some embodiments, the semiconductor wafer W is attached to the stage 308 and/or a wafer holder on the stage 308 by a carrier film. The tool controller 304 communicates with a tool control unit 309, which may directly control operation of the tool 136 and/or the stage 308. In some embodiments, the tool control unit 309 controls the tool 136 to scrub at least one surface of the semiconductor wafer W, in-situ and within the post-CMP chamber 104, according to a post-CMP recipe. In some embodiments, the tool control unit 309 includes a hardware device, such as an instance of the device 600 set forth herein with reference to FIG. 6. In some embodiments, the stage 308 is rotatable about an axis perpendicular to the surface 106 of the semiconductor wafer W. Scanning is performed, in-situ and within the post-CMP chamber 104, over the semiconductor wafer W, as set forth herein. Detecting is performed, in-situ and within the post-CMP chamber 104, as set forth herein.

According to some embodiments, the post-CMP apparatus 302 includes a source positioning unit 310 and a light generation unit 312 under control of the tool controller 304. In some embodiments, the source positioning unit 310 includes positioning components, such as positioning members, gears, electrical motors, etc., that respond to instructions, such as from the tool controller 304, to position the light source 138. In some embodiments, the source positioning unit 310 includes a hardware device, such as an instance of the device 600 set forth herein with reference to FIG. 6, that interprets instructions, such as from the tool controller 304, to control the positioning components to position the light source 138. The source positioning unit 310 may position the light source 138 and/or a component of the light source 138 to direct the light signal 110*a* to the target area 108, a zone of the target area 108, or another location about the surface 106 of the semiconductor wafer W. The light generation unit 312 may generate the light signal 110*a* and/or information corresponding to the light signal 110*a* under control of the tool controller 304. In some embodiments, the light generation unit 312 includes a laser 314 and an output of the laser 314 is connected to the light source 138 by way of an optical cable, such as a fiber optic cable, to scan the surface 106 of the semiconductor wafer W. In some embodiments, the light generation unit 312 outputs control information to control a laser contained within the light source 138 to scan the surface 106 of the semiconductor wafer W. In some embodiments, the post-CMP apparatus 302 includes a detector positioning unit 316 and a light detection unit 318 under control of the tool controller 304. The detector positioning unit 316 may position the detector 140 and/or a component of the detector 140 to detect the reflected light signal 110*b* reflected from the target area 108. In some embodiments, the detector positioning unit 316 includes positioning components, such as positioning members, gears, electrical motors, etc., that respond to instructions, such as from the tool controller 304, to position the detector 140. In some embodiments, the detector positioning unit 316 includes a hardware device, such as an instance of the device 600 set forth herein with reference to FIG. 6, that interprets instructions, such as from the tool controller 304, to control the positioning components to position the detector 140. The light detection unit 318 may decode information output from the detector 140 corresponding to defects present in the target area 108 of the semiconductor wafer W and communicate the information to the tool controller 304. In some embodiments, the light detection unit 318 includes a hardware device, such as an instance of the device 600 set forth herein with reference to FIG. 6, to decode the information output from the detector 140. The tool controller 304 is configured to determine a defect count of defects present in the target area 108 of the semiconductor wafer W based on the reflected light signal 110*b* reflected from the target area 108. In some embodiments, the tool controller 304 determines that the defect count exceeds a threshold, and the tool 136 is configured to re-scrub the target area 108 responsive to the tool controller 304 determining that the defect count exceeds a threshold.

With reference to FIGS. 3B-3C and according to some embodiments, an implementation 100 includes the system controller 306 to communicate with and/or control a plurality of post-CMP apparatuses and/or a CMP apparatus 320. In some embodiments, the CMP apparatus 320 includes a stage 322 to retain the semiconductor wafer W with respect to a CMP tool 324 within a CMP chamber 325. The CMP tool 324 cooperates with a slurry dispenser 326 to dispense a slurry 328 onto the semiconductor wafer W and/or the CMP tool 324 according to a CMP recipe. In some embodiments, the slurry 328 comprises a surfactant, such as an ionized or deionized surfactant that aids in removal of a portion of the material layer 120, such as to aid in removal of metal oxide from an oxidized layer. In some embodiments, the surfactant comprises an anionic surfactant, such as dioctyl sodium sulfosuccinate (DOSS), perfluorooctanesulfonate (PFOS), linear alkylbenzene sulfonates, sodium lauryl ether sulfate, lignosulfonate, sodium stearate, etc. In some embodiments, the surfactant comprises a nonionic surfactant, such as polyoxyethylene glycol octylphenol ethers, polyoxyethylene glycol alkylphenol ethers, etc. The CMP recipe may include one or more operations associated with CMP, such as movement of the CMP tool 324 to a tool position to work the semiconductor wafer W, applying the CMP tool 324 to the semiconductor wafer W, applying the slurry 328 to the CMP tool 324 and/or the semiconductor wafer W, etc. The CMP recipe may include one or more CMP parameters, such as a tool time in position, a tool rotation speed, a tool downforce, a slurry composition, etc. The CMP apparatus 320 may communicate the CMP recipe and/or the one or more CMP parameters with the system controller 306 for storage and/or use during post-CMP processing by the plurality of CMP apparatuses.

With reference to FIG. 3B and according to some embodiments, the system controller 306 communicates with and/or controls a plurality of post-CMP apparatuses, such as a post-CMP cylindrical brush apparatus 330, a post-CMP vertical apparatus 332, and a post-CMP pencil pad apparatus 334. With reference to FIG. 3C, the system controller 306 communicates with and/or controls a post-CMP brush pad apparatus 336, a post-CMP spray apparatus 338, and a post-CMP vibration apparatus 339. In some embodiments, the system controller 306 communicates one or more post-CMP recipes and/or one or more post-CMP parameters associated with the one or more post-CMP recipes with the plurality of post-CMP apparatuses. In some embodiments, the system controller 306 may adjust a first recipe performed by a first post-CMP apparatus and/or a first recipe parameter of the first recipe performed by the first post-CMP apparatus based on a defect count of a first target area of a first semiconductor wafer determined by the first post-CMP apparatus. In some embodiments, the system controller 306 may adjust the first recipe performed by the first post-CMP apparatus and/or the first recipe parameter of the first recipe performed by the first post-CMP apparatus based on a defect count of the first target area of the first semiconductor wafer determined by a second post-CMP apparatus. In some embodiments, the system controller 306 may adjust the first recipe performed by the first post-CMP apparatus and/or the first recipe parameter of the first recipe performed by the first post-CMP apparatus based on a defect count of the first target area of the first semiconductor wafer determined by a second post-CMP apparatus and a third post-CMP apparatus. In this case, a total defect count associated with the first target area includes a defect count determined by the second post-CMP apparatus and a defect count determined by the third post-CMP apparatus.

According to some embodiments, the post-CMP cylindrical brush apparatus 330 includes a post-CMP cylindrical brush chamber 340 configured to retain the semiconductor wafer W for performing a cylindrical brush mechanical scrubbing on the surface 106 according to a post-CMP cylindrical brush recipe. In some embodiments, the cylindrical brush mechanical scrubbing is performed by at least one of a first cylindrical brush 342 and/or a second cylindrical brush 344. In some embodiments, the semiconductor wafer W is positioned within the post-CMP cylindrical brush chamber 340 in a horizontal orientation relative to a bottom surface 346 of the post-CMP cylindrical brush chamber 340. The post-CMP cylindrical brush recipe may include a sequence of operations, such as:

1. align the first cylindrical brush 342 in a first position with respect to a first zone of the target area 108 on the surface 106 of the semiconductor wafer W;
2. cylindrically rotate the first cylindrical brush 342 at an angle to the surface 106 of the semiconductor wafer W;

3. apply the first cylindrical brush 342 in contact with the surface 106 of the semiconductor wafer W with a downforce at the first position;
4. move the first cylindrical brush 342 from the first position to a second position with respect to a second zone of the target area 108 in contact with the surface 106 of the semiconductor wafer W; and
5. remove the first cylindrical brush 342 from contact with the semiconductor wafer W.

The post-CMP cylindrical brush recipe may include a plurality of parameters, such as: the first position, the target area, the first zone of the target area, the rotational speed of the first cylindrical brush 342, the angle of the first cylindrical brush 342 to the surface 106, the downforce, the time of contact of the first cylindrical brush 342 with the surface 106 at the first position, the second position, the second zone of the target area, etc. Other arrangements, configurations, recipes, or recipe parameters of the cylindrical brush mechanical scrubbing are within the scope of the present disclosure.

According to some embodiments, the post-CMP vertical apparatus 332 includes a post-CMP vertical chamber 350 configured to retain the semiconductor wafer W vertically for performing a vertical mechanical scrubbing on the surface 106 according to a post-CMP vertical recipe. In some embodiments, the vertical mechanical scrubbing is performed by at least one of a first brush 352 and/or a second brush 354. In some embodiments, the semiconductor wafer W is positioned within the post-CMP vertical chamber 350 in a vertical orientation relative to a bottom surface 356 of the post-CMP vertical chamber 350. The post-CMP vertical recipe may include a sequence of operations, such as:
1. align the first brush 352 in a first position with respect to a first zone of the target area 108 on the surface 106 of the semiconductor wafer W;
2. cylindrically rotate the first brush 352 at an angle to the surface 106 of the semiconductor wafer W;
3. apply the first brush 352 in contact with the surface 106 of the semiconductor wafer W with a downforce at the first position;
4. move the first brush 352 from the first position to a second position with respect to a second zone of the target area 108 in contact with the surface 106 of the semiconductor wafer W; and
5. remove the first brush 352 from contact with the semiconductor wafer W.

The post-CMP vertical recipe may include a plurality of parameters, such as: the first position, the target area, the first zone of the target area, the rotational speed of the first brush 352, the angle of the first brush 352 to the surface 106, the downforce, the time of contact of the first brush 352 with the surface 106 at the first position, the second position, the second zone of the target area, etc. Other arrangements, configurations, recipes, or recipe parameters of the vertical mechanical scrubbing are within the scope of the present disclosure.

According to some embodiments, the post-CMP pencil pad apparatus 334 includes a post-CMP pencil pad chamber 360 configured to retain the semiconductor wafer W for performing a pencil pad mechanical scrubbing on the surface 106 according to a post-CMP pencil pad recipe. In some embodiments, the pencil pad scrubbing is performed by a pencil pad brush 364 of a pencil pad 362. In some embodiments, the semiconductor wafer W is positioned within the post-CMP pencil pad chamber 360 in a horizontal orientation relative to a bottom surface 366 of the post-CMP pencil pad chamber 360. The post-CMP pencil pad recipe may include a sequence of operations, such as:
1. align the pencil pad 362 in a first position with respect to a first zone of the target area 108 on the surface 106 of the semiconductor wafer W;
2. cylindrically rotate the pencil pad brush 364 orthogonal to the surface 106 of the semiconductor wafer W;
3. apply the pencil pad brush 364 in contact with the surface 106 of the semiconductor wafer W with a downforce at the first position;
4. move the pencil pad brush 364 from the first position to a second position with respect to a second zone of the target area 108 in contact with the surface 106 of the semiconductor wafer W; and
5. remove the pencil pad brush 364 from contact with the semiconductor wafer W.

The post-CMP pencil pad recipe may include a plurality of parameters, such as: the first position, the target area, the first zone of the target area, the rotational speed of the pencil pad brush 364, the downforce, the time of contact of the pencil pad brush 364 with the surface 106 at the first position, the second position, the second zone of the target area, etc. Other arrangements, configurations, recipes, or recipe parameters of the pencil pad mechanical scrubbing are within the scope of the present disclosure.

According to some embodiments, the post-CMP brush pad apparatus 336 includes a post-CMP brush pad chamber 370 configured to retain the semiconductor wafer W for performing a brush pad mechanical scrubbing on the surface 106 according to a post-CMP brush pad recipe. In some embodiments, the brush pad mechanical scrubbing is performed by a post-CMP tool 372 connected to a post-CMP tool component 374. In some embodiments, the post-CMP tool component 374 is a brush pad or a sponge. In some embodiments, the semiconductor wafer W is positioned within the post-CMP brush pad chamber 370 in a horizontal orientation relative to a bottom surface 376 of the post-CMP brush pad chamber 370. The post-CMP brush pad recipe may include a sequence of operations, such as:
1. align the post-CMP tool 372 in a first position with respect to a first zone of the target area 108 on the surface 106 of the semiconductor wafer W;
2. cylindrically rotate the post-CMP tool component 374 at an angle to the surface 106 of the semiconductor wafer W;
3. apply the post-CMP tool component 374 in contact with the surface 106 of the semiconductor wafer W with a downforce at the first position;
4. move the post-CMP tool component 374 from the first position to a second position with respect to a second zone of the target area 108 in contact with the surface 106 of the semiconductor wafer W; and
5. remove the post-CMP tool component 374 from contact with the semiconductor wafer W.

The post-CMP brush pad recipe may include a plurality of parameters, such as: the first position, the target area, the first zone of the target area, the rotational speed of the post-CMP tool component 374, the angle of the post-CMP tool component 374 to the surface 106, the downforce, the time of contact of the post-CMP tool component 374 with the surface 106 at the first position, the second position, the second zone of the target area, etc. Other arrangements, configurations, recipes, or recipe parameters of the brush pad mechanical scrubbing are within the scope of the present disclosure.

According to some embodiments, the post-CMP spray apparatus 338 includes a post-CMP spray chamber 380 configured to retain the semiconductor wafer W for performing a spray application on the surface 106 according to a post-CMP spray application recipe. In some embodiments, the spray application is performed by a post-CMP spray applicator 382 outputting a spray 384. In some embodiments, the semiconductor wafer W is positioned within the post-CMP spray chamber 380 in a horizontal orientation relative to a bottom surface 386 of the post-CMP spray chamber 380. The post-CMP spray application recipe may include a sequence of operations, such as:

1. align the post-CMP spray applicator 382 in a first position with respect to a first zone of the target area 108 on the surface 106 of the semiconductor wafer W;
2. align the post-CMP spray applicator 382 at an angle to the surface 106 of the semiconductor wafer W;
3. apply the spray 384 in contact with the surface 106 of the semiconductor wafer W with a spray force at the first position;
4. move the post-CMP spray applicator 382 from the first position to a second position with respect to a second zone of the target area 108 in contact with the surface 106 of the semiconductor wafer W; and
5. discontinue the spray 384 from contact with the semiconductor wafer W.

The post-CMP spray application recipe may include a plurality of parameters, such as: the first position, the target area, the first zone of the target area, the angle of the post-CMP spray applicator 382 to the surface 106, the spray force, the time of application of the spray 384 with the surface 106 at the first position, the second position, the second zone of the target area, etc. Other arrangements, configurations, recipes, or recipe parameters of the spray application are within the scope of the present disclosure.

According to some embodiments, the post-CMP vibration apparatus 339 includes a post-CMP vibration chamber 390 configured to retain the semiconductor wafer W for performing a vibration application on the surface 106 according to a post-CMP vibration recipe. In some embodiments, the vibration application is performed by a post-CMP vibrator 392 that vibrates a stage 394 retaining the semiconductor wafer W. In some embodiments, the vibration application is performed by a post-CMP fluid dispenser 396 outputting a fluid 398 to contact the surface 106. In some embodiments, the fluid 398 is a non-reactive chemical liquid fluid, water, a combination of a non-reactive chemical liquid fluid and water, a gas fluid, an air fluid, a combination of a gas fluid and an air fluid, or another type of fluid configured to remove defects from the surface 106 of the semiconductor wafer W. In some embodiments the fluid 398 applies a force to the defects on the surface 106 in combination with vibration applied by the post-CMP vibrator 392 to eject defects from the surface 106. In some embodiments, the semiconductor wafer W is positioned within the post-CMP vibration chamber 390 in a horizontal orientation relative to a bottom surface 399 of the post-CMP vibration chamber 390. The post-CMP vibration recipe may include a sequence of operations, such as:

1. align the post-CMP fluid dispenser 396 in a first position with respect to a first zone of the target area 108 on the surface 106 of the semiconductor wafer W;
2. align the post-CMP fluid dispenser 396 at an angle to the surface 106 of the semiconductor wafer W;
3. apply the vibration to the semiconductor wafer W;
4. dispense the fluid 398 in contact with the surface 106 of the semiconductor wafer W with a fluid force at the first position;
5. move the post-CMP fluid dispenser 396 from the first position to a second position with respect to a second zone of the target area 108;
6. discontinue dispensing the fluid 398; and
7. discontinue the vibration.

The post-CMP vibration application recipe may include a plurality of parameters, such as: the first position, the target area, the first zone of the target area, the angle of the post-CMP fluid dispenser 396 to the surface 106, the vibration force, the time of vibration, the time of dispensing the fluid 398 at the first position, the second position, the second zone of the target area, etc. Other arrangements, configurations, recipes, or recipe parameters of the vibration application are within the scope of the present disclosure.

FIGS. 4A-4B illustrate an implementation 100 of the light source 138 and the detector 140, according to some embodiments. Referring to FIG. 4A and according to some embodiments, the light source 138 outputs the light signal 110a from the light generation unit 312 at a position determined by the source positioning unit 310. In some embodiments, the source positioning unit 310 and the light generation unit 312 are external to a structure 402 of the light source 138, such as disposed external to the post-CMP chamber 104. In some embodiments, the source positioning unit 310 and the light generation unit 312 are internal to the structure 402 of the light source 138. The light generation unit 312 and the source positioning unit 310 communicate control information with the tool controller 304. In some embodiments, the light signal 110a is a laser light signal output from the light generation unit 312 through a transmission medium 404, such as a fiber optic cable. The light signal 110a may be transmitted through the transmission medium 404 and directed by a lens 406 through a window 408. In some embodiments, the lens 406 is a diffraction grating that deflects the light signal 110a onto the target area 108 of the semiconductor wafer W. The lens 406 directs the light signal 110a toward the target area 108 on the surface 106 of the semiconductor wafer W, as set forth herein. For example, the light source 138 may direct the light signal 110a to the target area 108, a zone of the target area 108, or another location about the surface 106 of the semiconductor wafer W. In some embodiments, the lens 406 is positioned within the structure 402 by a first actuator 410 and/or a second actuator 412, which are controlled by the source positioning unit 310. In some embodiments, a fluid 414 output through a valve 416 may be directed towards the window 408 to remove particles that may be formed thereon by a post-CMP process. In some embodiments, a wiper 418 may be controlled by a wiper unit 420 to remove particles from the window 408.

Referring to FIG. 4B and according to some embodiments, the detector 140 detects the reflected light signal 110b with a light detection unit 318 at a position determined by the detector positioning unit 316. In some embodiments, the detector positioning unit 316 and the light detection unit 318 are external to a structure 422 of the detector 140, such as disposed external to the post-CMP chamber 104. In some embodiments, the detector positioning unit 316 and the light detection unit 318 are internal to the structure 422 of the detector 140. The light detection unit 318 and the detector positioning unit 316 communicate control information with the tool controller 304. In some embodiments, the light detection unit 318 is a spectrometer to measure a reflectance, a transmittance, and/or a polarization state of the reflected light signal 110b. In some embodiments, the reflected light signal 110b is a reflected laser light signal detected by a detection panel 424 through a window 426.

According to some embodiments, the detection panel 424 may be a semiconductor detection panel configured to produce an electrical signal corresponding to an intensity of radiation impinging on a radiation detecting element, such as a charge-coupled device (CCD), a complementary metal-oxide-semiconductor (CMOS) radiation detecting panel, an array of radiation detecting elements, such as photodiodes, a CMOS active pixel image sensor (APS), a pinned photodiode (PPD) array, a front side illuminated (FSI) image sensor, a back side illuminated (BSI) image sensor, or other type of semiconductor image sensor. The detection panel 424 may detect the reflected light signal 110b from the target area 108 on the surface 106 of the semiconductor wafer W, as set forth herein. For example, the detection panel 424 may detect the reflected light signal 110b from the target area 108, a zone of the target area 108, or another location about the surface 106 of the semiconductor wafer W. The light detection unit 318 may decode information output from the detection panel 424 corresponding to defects present in the target area 108 of the semiconductor wafer W and communicate the information to the tool controller 304. In some embodiments, the reflected light signal 110b is directed toward the detection panel 424 by a lens 428. In some embodiments, the lens 428 is a diffraction grating that deflects the reflected light signal 110b onto the detection panel 424. The detection panel 424 and/or the lens 428 may be positioned within the structure 422 by a first actuator 430 and/or a second actuator 432, which are controlled by the detector positioning unit 316. In some embodiments, a fluid 434 output through a valve 436 may be directed towards the window 426 to remove particles that may be formed thereon by a post-CMP process. In some embodiments, a wiper 438 may be controlled by a wiper unit 440 to remove particles from the window 426.

According to some embodiments, the light source 138 may generate the light signal 110a and the detector 140 may detect the reflected light signal 110b to determine the defect count using laser particle counting (LPC). During LPC, the light signal 110a is a laser beam projected onto the surface 106 of the semiconductor wafer W, and the detector receives the reflected light signal 110b as a reflection of the laser beam. When no defects are present in the path of the laser beam, the detector 140 receives the reflected laser beam and no defects are detected. When a defect and/or particle is in the path of the laser beam, the reflected laser beam is blocked and hence not received by the detector 140. The blocking durations of the reflected laser beam correspond to the size of the defects and/or particles. Accordingly, the number of blocking durations of the reflected laser beam from the target area 108 corresponds to the defect count of defects present in the target area 108. In some embodiments, the light detection unit 318 may determine the number of blocking durations of the reflected laser beam and the tool controller 304 may determine the defect count based on the number of blocking durations determined by the light detection unit 318.

According to some embodiments, the light source 138 may generate the light signal 110a and the detector 140 may detect the reflected light signal 110b to determine the defect count using Fourier Transform Infrared Spectroscopy (FTIR). In FTIR, the light signal 110a is an infrared light signal projected onto the semiconductor wafer W and the reflected light signal 110b is an infrared light signal received by the detection panel 424. The detection panel then communicates information to the light detection unit 318 to generate an FTIR spectrum. Materials on the surface 106 of the semiconductor wafer W result in light of different frequencies to be absorbed, and hence the resulting FTIR spectrum has characteristic peaks in response to different materials, including defects. For example, water ($H_2O$) and silicon oxide ($SiO_2$) have characteristic peaks in the FTIR spectrum. When multiple types of materials and/or defects are present at the surface 106 of the semiconductor wafer W, the combination of the characteristic peaks of the multiple materials and/or defects will present in the respective FTIR spectrum. The FTIR spectrum in accordance with some embodiments covers the wavenumber ranging from 250 to 4,000 $cm^{-1}$.

According to some embodiments, the tool controller 304 receives the signal from the light detection unit 318, generates the FTIR spectrum, and compares the characteristic peaks in the FTIR spectrum with a database, which stores the data of the characteristic peaks of a plurality of materials and/or defects that may be present on the surface 106 of the semiconductor wafer W. When characteristic peaks of a material(s) are found in the FTIR spectrum, a determination can be made as to the respective materials present on the surface 106 of the semiconductor wafer W. For example, the characteristic peaks of $SiO_2$ are at 2,366, 1,377, 1,463, 2,855, 2,924, and 2,964 (units of $cm^{-1}$ and with variation of +−0.10 $cm^{-1}$). The characteristic peaks of $Al_2O_3$ are at 2,855, 2,924, and 2,964 (units of $cm^{-1}$ and with variation of +−0.10 $cm^{-1}$). The characteristic peaks of BTA are at 742, 753, 779, 1,009, 1,023, 1,210, 2,766, 2,796, and 2,870 (units of $cm^{-1}$ and with variation of +−0.10 $cm^{-1}$). The characteristic peaks of PVA are at 1,098, 1,145, 1,239, 1,334, 1,497, 1,442, 1,661, 1,711, 2,837, 2,906, 2,923, and 2,945 (units of $cm^{-1}$ and with variation of +−0.10 $cm^{-1}$). The characteristic peaks of PVC are at 612, 890, 835, 966, 1,098, 1,199, 1,254, 1,333, 1,428, 1,435, 2,913, and 2,970 (units of $cm^{-1}$ and with variation of +−0.10 $cm^{-1}$). The characteristic peaks of silicon nitride ($Si_3N_4$) are at 1,377, 1,463, 2,852, 2,910, 2,921 (units of $cm^{-1}$ and with variation of +−0.10 $cm^{-1}$).

When using FTIR, characteristic peaks of water and carbon dioxide may be excluded. The characteristic peaks of water are at 1,640, 2,130, and 3,000-3600 (units of $cm^{-1}$ and with variation of +−0.10 $cm^{-1}$). The characteristic peaks of carbon dioxide are at 665 (units of $cm^{-1}$ and with variation of +−0.10 $cm^{-1}$), 2,280 (units of $cm^{-1}$ and with variation of +−0.10 $cm^{-1}$), and 2,350 (units of $cm^{-1}$ and with variation of +−0.20 $cm^{-1}$). If characteristic peaks of foreign materials are found, such peak indicate presence of a defect and the defect is added to the defect count. For example, BTA, PVA, and PVC are brush materials, and such characteristic peaks in the FTIR spectrum indicate that particles fell from a brush are were not cleaned. Aluminum oxide and silicon oxide may be the abrasives of a CMP slurry, and such characteristic peaks in the FTIR spectrum indicate the presence of a defect.

According to some embodiments, the light source 138 may generate the light signal 110a and the detector 140 may detect the reflected light signal 110b to determine the defect count using the Raman spectrum. The light source 138 generated the light signal 110a as a laser signal projected onto the surface 106 of the semiconductor wafer W. The reflected light signal 110b is a reflected laser signal, which is detected by the detection panel 424 and communicated to the light detection unit 318 to generate a Raman spectrum. Materials and/or defects present on the surface 106 of the semiconductor wafer W result in a Raman spectrum having characteristic peaks. Materials used in CMP and post-CMP have characteristic Raman peaks, such as PVA, silicon, etc. When multiple types of materials and/or defects are present at the surface 106 of the semiconductor wafer W, the combination of characteristic peaks of the respective materials will present in respective Raman spectrum. The Raman spectrum covers the wavenumber ranging from 250 to 4,000 $cm^{-1}$.

When using a Raman spectrum to determine a defect count in the target area 108, characteristic peaks of water may be excluded. The characteristic peaks of water are at 1,640, 3,420, and 3,630 (units of $cm^{-1}$ and with variation of +−0.10 $cm^{-1}$). The characteristic peak of Si is at 520 (units of $cm^{-1}$ and with variation of +−0.10 $cm^{-1}$). The characteristic peaks of $Al_2O_3$ are at 383 and 421 (units of $cm^{-1}$ and with variation of +−0.10 $cm^{-1}$). The characteristic peaks of BTA are at 533, 796, 1,039, 1,425, 1,567, 1,752, 1,870, 3,303, and 3,330 (units of $cm^{-1}$ and with variation of +−0.10 $cm^{-1}$). The characteristic peaks of PVA are at 633, 887, 1,023, 1,145, 1,445, 1,733, 2,940, and 2,973 (units of $cm^{-1}$ and with variation of +−0.10 $cm^{-1}$). The characteristic peaks of PVC are at 360, 634, 693, 962, 1,108, 1,175, and 1,253 (units of $cm^{-1}$ and with variation of +−0.10 $cm^{-1}$). The characteristic peaks of silicon nitride ($Si_3N_4$) are at 465, 512, 826, and 860 (units of $cm^{-1}$ and with variation of +−0.10 $cm^{-1}$).

In some embodiments, the tool controller 304 receives a signal from the light detection unit 318, generates the Raman spectrum, and compares the characteristic peaks of the Raman spectrum with a database. The database may store the data of characteristic peaks of materials that may be present on the surface 106 of the semiconductor wafer W. Other arrangements and/or configurations of the light source 138 and/or the detector 140 are within the scope of the present disclosure.

Figure 5B:
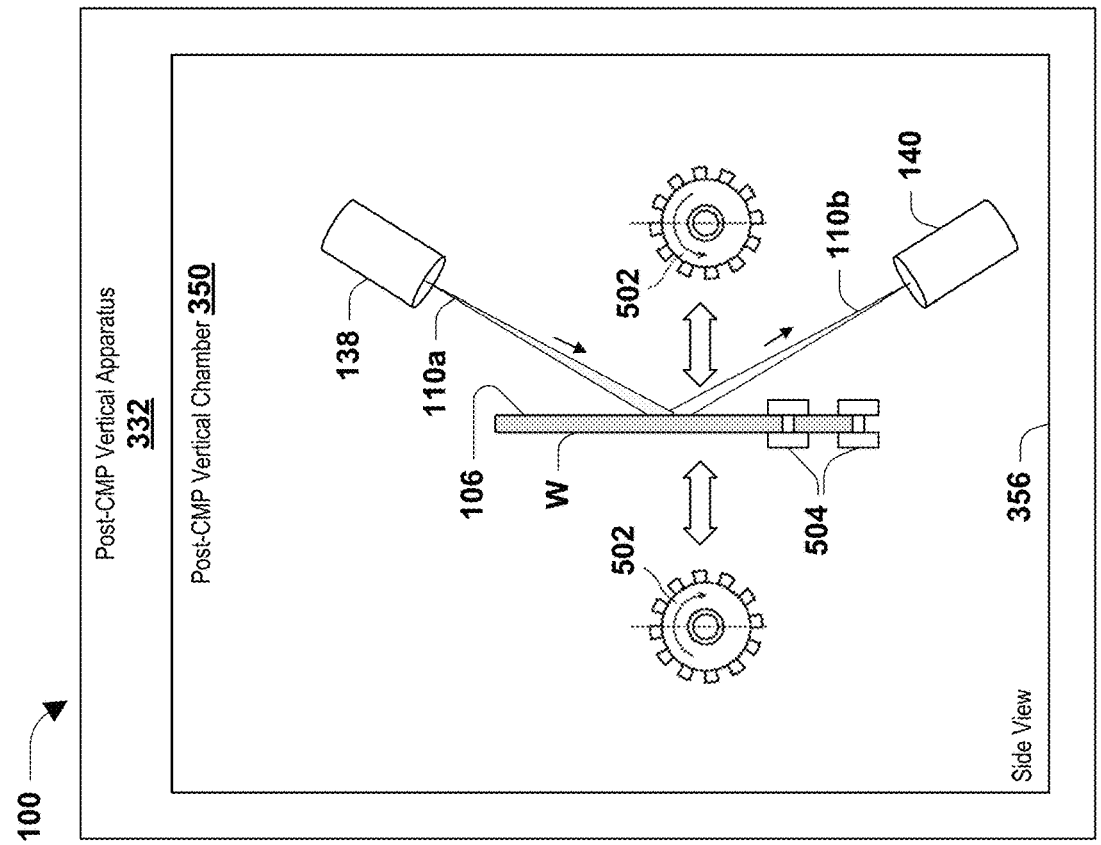
FIGS. 5A-5B illustrate an implementation of a post-CMP vertical apparatus, according to some embodiments.
Figure 5A:
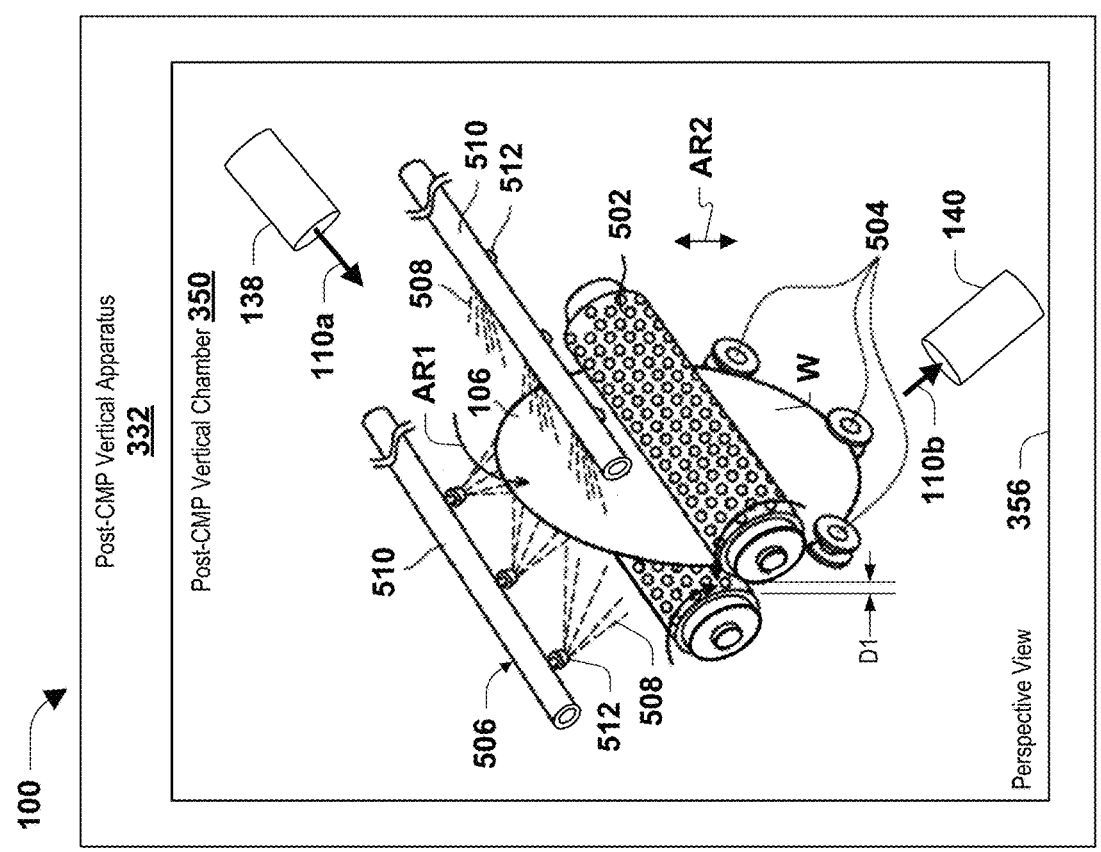

FIGS. 5A-5B illustrate an implementation 100 of the post-CMP vertical apparatus 332, according to some embodiments. According to some embodiments, the post-CMP vertical apparatus 332 includes a pair of brushes 502 for performing a scrubbing process onto both surfaces of the semiconductor wafer W. During the scrubbing process, the semiconductor wafer W is supported by a plurality of rollers 504 (support mechanism) in a vertical orientation in the post-CMP vertical chamber 350 and is rotatable by the rollers 504, as indicated by arrow AR1. The brushes 502 may, for example, be porous and/or sponge like, and/or may be made of a resilient material such as polyvinyl acetate (PVA). During the scrubbing process, each brush 502 is rotatably mounted on a respective spindle (not shown), and the pair of brushes 502 may be driven by a drive mechanism (not shown) or mechanisms to move vertically along the diameter direction of the semiconductor wafer W and rotate/scrub over both surfaces of the semiconductor wafer W, as indicated by arrow AR2. A horizontal space D1 between the two brushes 502, related to the scrubbing force applied to the semiconductor wafer W, is adjustable by moving the brushes 502 via the drive mechanism.

In some embodiments, the post-CMP vertical apparatus 332 includes a fluid delivery unit 506 for delivering a fluid, such as cleaning solution 508 to the semiconductor wafer W via a spray assembly 510. The spray assembly 510 includes a plurality of nozzles 512 for delivering the cleaning solution 508. The cleaning solution 508 may assist the scrubbing process performed by the post-CMP vertical apparatus 332 by washing defects, such the particle 128 or the residue 130 from the brushes 502 and/or the surface 106 of the semiconductor wafer W. The cleaning solution 508 may include various types to clean different particles and/or residue the semiconductor wafer W. In some embodiments, the cleaning solution 508 may include water with no reactive chemicals intentionally added, deionized water, surfactants such as sodium dodecyl sulfate which may be added into the cleaning solution 508 in sufficient quantity to reduce surface tension without materially reacting with the semiconductor wafer W.

In some embodiments, the fluid delivery unit 506 includes the spray assembly 510 configured as a pair of spray bars driven by a drive mechanism (not shown) or mechanisms to rotate the nozzles 512 toward both surfaces of the semiconductor wafer W. The spray assembly 510 comprise a metal material (such as stainless steel) and the nozzles 512 may comprise ceramics, quartz, or another type of anti-corrosive material such as plastic. In some embodiments, the cleaning solution 508 may be applied in various shapes including a jet shape, a fan shape, a mist shape, or the like. In some embodiments, a gas source (not shown) may supply N2 or other inert gas to the spray assembly 510 to configurated the shape of the cleaning solution 508 and/or direct the cleaning solution 508 from the spray assembly 510. In some embodiments, the cleaning solution 508 may discharge from the nozzles 512 with various spray shapes due to the mixing of the inert gas and the cleaning solution 508. In some embodiments, the gas source has a variable pressure. For example, the gas source may have a medium pressure such as 50 to 250 psi. The nozzles 512 may spray the cleaning solution 508 with a jet shape if the gas source has a higher pressure, such as 250 to 1000 psi, or spray the cleaning solution 508 with a mist shape if the gas source has a lower pressure, such as 10 to 50 psi. In accordance with some embodiments, the spray assembly 510 may have a filter therein to prevent impurities such as dust and/or organic material within the cleaning solution 508 from adhering onto the semiconductor wafer W or blocking the nozzles 512. For example, the filter may be mounted on the inlet end to filter impurities X of the cleaning solution 508. The filter may be a mesh filter with pore size in a range from, for example, 1 nm to 1000 nm and may be made of stainless steel, plastic, nylon, woven fiberglass, or other non-corrosive materials. Other arrangements and/or configurations of the fluid delivery unit 506 are within the scope of the present disclosure.

Figure 6:
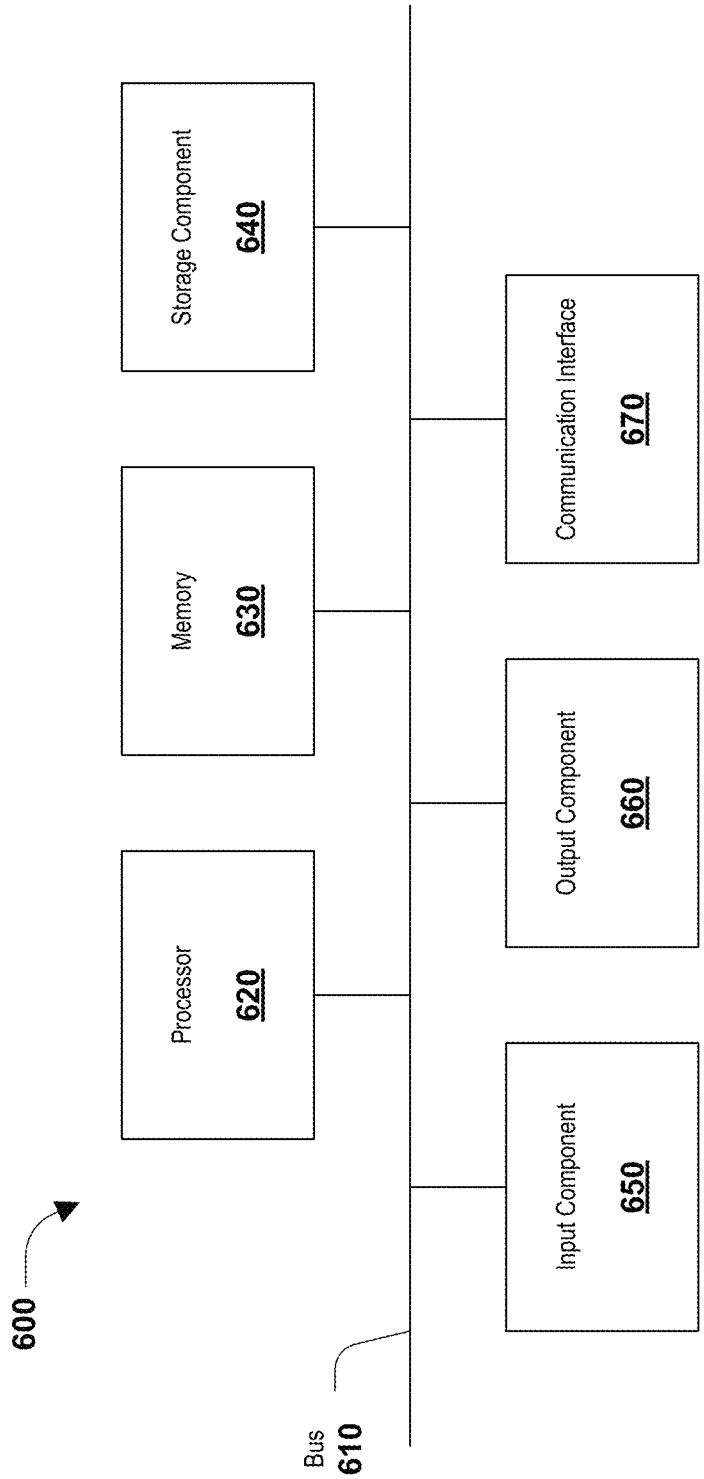
FIG. 6 illustrates example components of a device, according to some embodiments.

FIG. 6 illustrates example components of a device 600 according to some embodiments. According to some embodiments, the device 600 may correspond to at least some of at least one of the tool controller 304, the system controller 306, the source positioning unit 310, the detector positioning unit 316, the light detection unit 318, or the tool control unit 309. As illustrated in FIG. 6, the device 600 may include a bus 610, a processor 620, a memory 630, a storage component 640, an input component 650, an output component 660, and/or a communication interface 670. The bus 610 may include a component that permits communication among the components of the device 600. The processor 620 may be implemented in hardware, firmware, or a combination of hardware and software. The processor 620 is a central processing unit (CPU), a graphics processing unit (GPU), an accelerated processing unit (APU), a microprocessor, a microcontroller, a digital signal processor (DSP), a field-programmable gate array (FPGA), an application-specific integrated circuit (ASIC), another type of processing component, or a combination thereof. In some implementations, the processor 620 includes one or more processors capable of being programmed to perform a function. The memory 630 may include a random access memory (RAM), a read only memory (ROM), and/or another type of dynamic or static storage device (e.g., a flash memory, a magnetic memory, and/or an optical memory) that stores information and/or instructions for use by the processor 620.

The storage component 640 stores information and/or software related to the operation and use of the device 600. For example, the storage component 640 may include a hard disk (e.g., a magnetic disk, an optical disk, a magneto-optic disk, and/or a solid state disk), a compact disc (CD), a digital versatile disc (DVD), a floppy disk, a cartridge, a magnetic tape, and/or another type of non-transitory computer-readable medium, along with a corresponding drive. The input component 650 includes a component that permits the device 600 to receive information, such as via user input (e.g., a touch screen display, a keyboard, a keypad, a mouse, a button, a switch, and/or a microphone). Additionally, or alternatively, the input component 650 may include a sensor for sensing information (e.g., a global positioning system (GPS) component, an accelerometer, a gyroscope, an actuator, and/or another type of sensor). The output component 660 may include a component that provides output information from device 600 (e.g., a display, a speaker, and/or one or more light-emitting diodes (LEDs)). The communication interface 670 includes a transceiver-like component (e.g., a transceiver and/or a separate receiver and transmitter) that enables the device 600 to communicate with other devices, such as via a wired connection, a wireless connection, or a combination of wired and wireless connections. The communication interface 670 may permit the device 600 to receive information from another device and/or provide information to another device. For example, the communication interface 670 may include an Ethernet interface, an optical interface, a coaxial interface, an infrared interface, a radio frequency (RF) interface, a universal serial bus (USB) interface, a Wi-Fi interface, a cellular network interface, and/or the like.

The device 600 may perform one or more processes described herein. The device 600 may perform these processes based on the processor 620 executing software instructions stored by a non-transitory computer-readable medium, such as the memory 630 and/or the storage component 640. A computer-readable medium is defined herein as a non-transitory memory device. A memory device may include memory space within a single physical storage device or memory space spread across multiple physical storage devices. Software instructions may be read into the memory 630 and/or the storage component 640 from another computer-readable medium or from another device via the communication interface 670. When executed, software instructions stored in the memory 630 and/or the storage component 640 may cause the processor 620 to perform one or more processes described herein. Additionally, or alternatively, hardwired circuitry may be used in place of or in combination with software instructions to perform one or more processes described herein. Thus, implementations described herein are not limited to any specific combination of hardware circuitry and software. The number and arrangement of the components shown in FIG. 6 are provided as an example. In practice, the device 600 may include additional components, fewer components, different components, or differently arranged components than those shown in FIG. 6. Additionally, or alternatively, a set of components (e.g., one or more components) of device 600 may perform one or more functions described as being performed by another set of components of the device 600.

Figure 7:
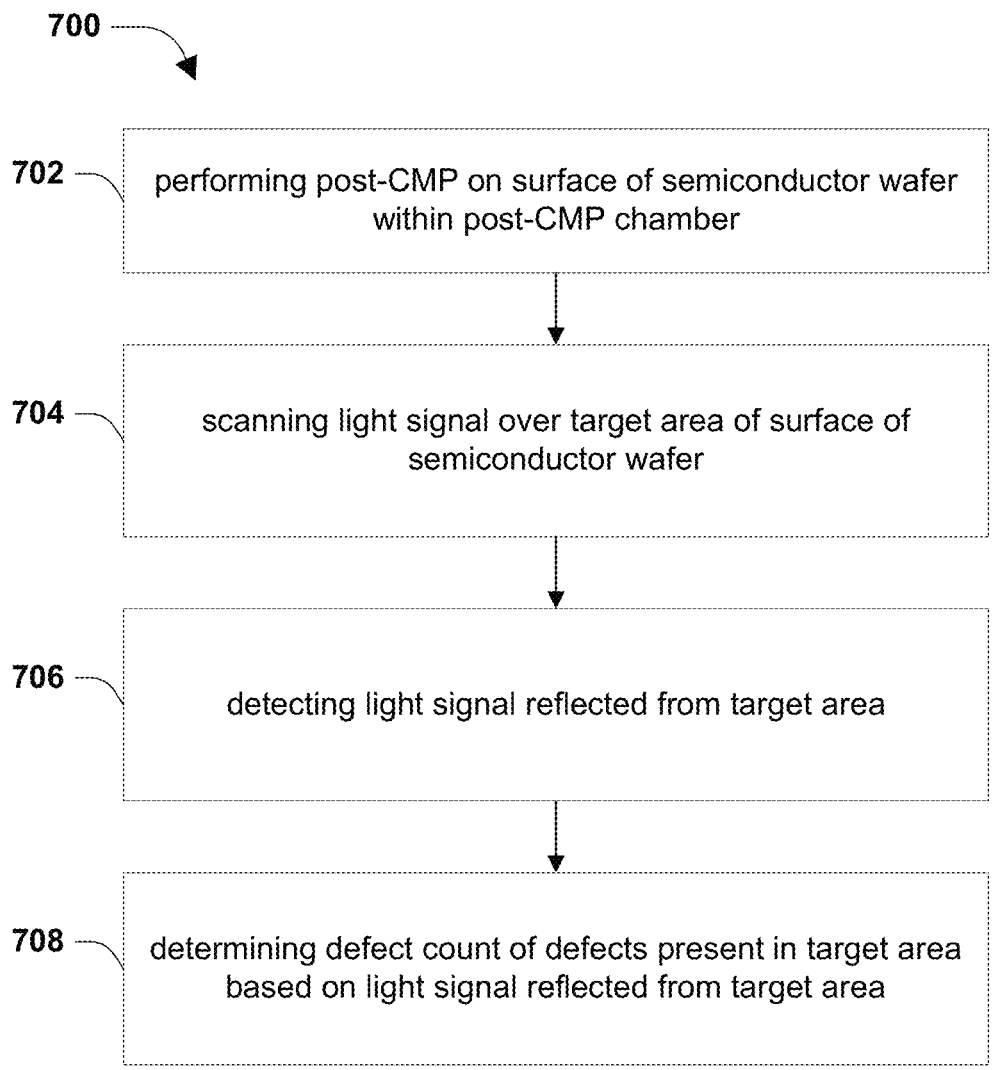
FIG. 7 illustrates an example method, according to some embodiments.

FIG. 7 illustrates an example method 700, according to some embodiments. Some of the operations described can be replaced and/or eliminated for different embodiments. At 702, post-CMP is performed, in-situ and according to a recipe on a surface of a semiconductor wafer within a post-CMP chamber. At 704, a light signal is scanned over a target area of the surface of the semiconductor wafer, in-situ and within the post-CMP chamber. At 706, the light signal reflected from the target area is detected in-situ and within the post-CMP chamber. At 708, a defect count of defects present in the target area is determined based on the light signal reflected from the target area.

Figure 8:
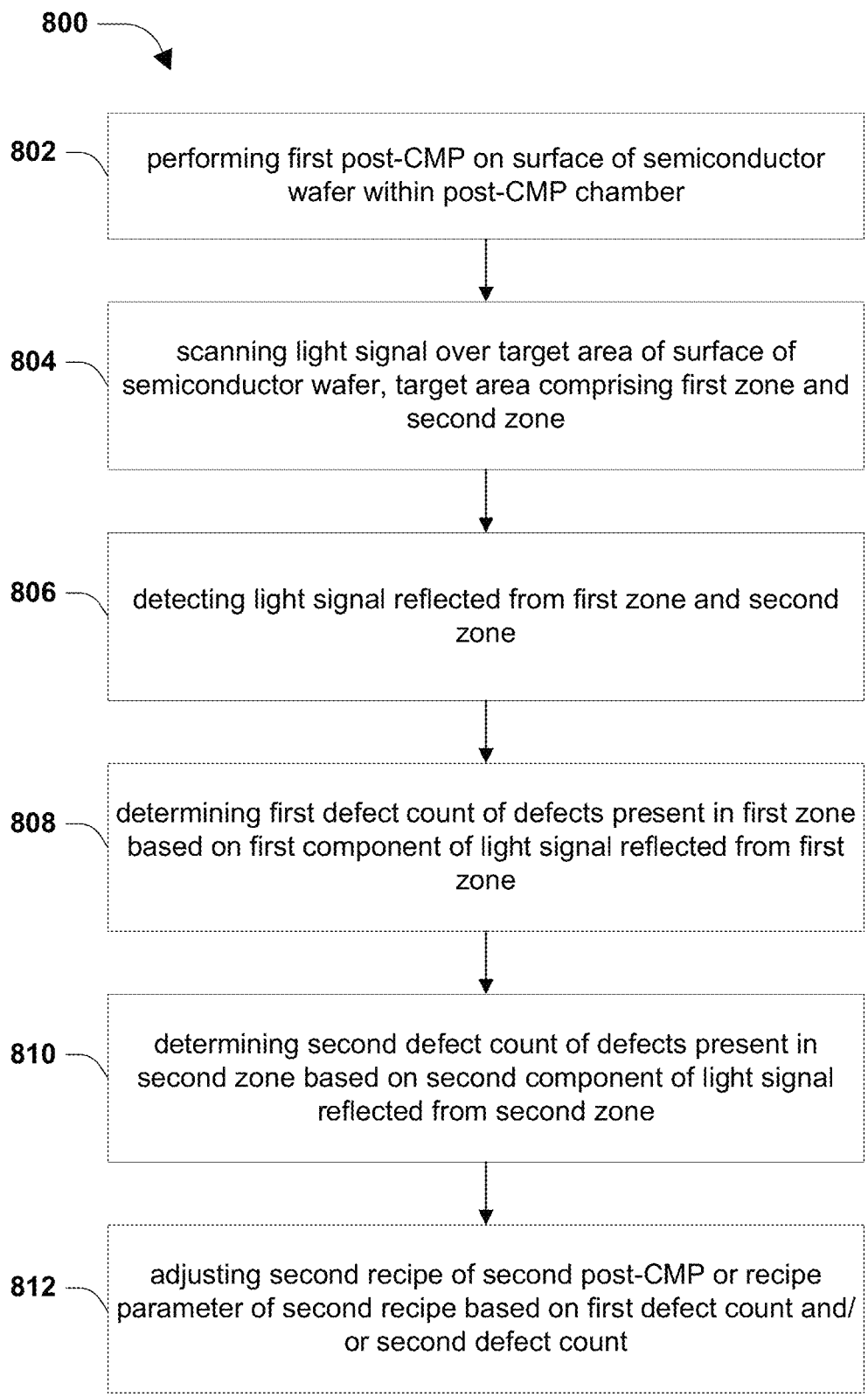
FIG. 8 illustrates an example method, according to some embodiments.

FIG. 8 illustrates an example method 800, according to some embodiments. Some of the operations described can be replaced and/or eliminated for different embodiments. At 802, a first post-CMP is performed, in-situ and according to a first recipe, on a surface of a semiconductor wafer within a post-CMP chamber. At 804, a light signal is scanned, in-situ and within the post-CMP chamber, over a target area of the surface of the semiconductor wafer. The target area comprises a first zone and a second zone. At 806, the light signal reflected from the first zone and the second zone is detected in-situ and within the post-CMP chamber. At 808, a first defect count of defects present in the first zone is determined based on a first component of the light signal reflected from the first zone. At 810, a second defect count of defects present in the second zone is determined based on a second component of the light signal reflected from the second zone. At 812, at least one of a second recipe of a second post-CMP or a recipe parameter of the second recipe to be performed on the surface of the semiconductor wafer is adjusted based on at least one of the first defect count or the second defect count.

According to some embodiments, a method is provided. The method includes performing, in-situ and according to a recipe, post chemical mechanical polishing (post-CMP) on a surface of a semiconductor wafer within a post-CMP chamber. The method includes scanning, in-situ and within the post-CMP chamber, a light signal over a target area of the surface of the semiconductor wafer, and detecting, in-situ and within the post-CMP chamber, a reflected light signal reflected from the target area. The method includes determining a defect count of defects present in the target area based on the reflected light signal reflected from the target area.

According to some embodiments, a method is provided. The method includes performing, in-situ and according to a first recipe, a first post chemical mechanical polishing (post-CMP) on a surface of a semiconductor wafer within a post-CMP chamber. The method includes scanning, in-situ and within the post-CMP chamber, a light signal over a target area of the surface of the semiconductor wafer, wherein the target area comprises a first zone and a second zone, and detecting, in-situ and within the post-CMP chamber, a reflected light signal reflected from the first zone and the second zone. The method includes determining a first defect count of defects present in the first zone based on a first component of the reflected light signal, and determining a second defect count of defects present in the second zone based on a second component of the reflected light signal. The method includes adjusting at least one of a second recipe of a second post-CMP or a recipe parameter of the second recipe to be performed on the surface of the semiconductor wafer based on at least one of the first defect count or the second defect count.

According to some embodiments, an apparatus is provided. The apparatus includes a post chemical mechanical polishing (post-CMP) chamber configured to receive a semiconductor wafer, and a tool configured to scrub at least one surface of the semiconductor wafer, in-situ and within the post-CMP chamber, according to a post-CMP recipe. The apparatus includes a light source configured to scan a light signal over a target area of the at least one surface of the semiconductor wafer in-situ within the post-CMP chamber, and a detector configured to detect a reflected light signal reflected from the target area. The apparatus includes a controller configured to determine a defect count of defects present in the target area based on the reflected light signal reflected from the target area.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

Although the subject matter has been described in language specific to structural features or methodological acts, it is to be understood that the subject matter of the appended claims is not necessarily limited to the specific features or acts described above. Rather, the specific features and acts described above are disclosed as example forms of implementing at least some of the claims.

Various operations of embodiments are provided herein. The order in which some or all of the operations are described should not be construed to imply that these operations are necessarily order dependent. Alternative ordering will be appreciated having the benefit of this description. Further, it will be understood that not all operations are necessarily present in each embodiment provided herein. Also, it will be understood that not all operations are necessary in some embodiments.

It will be appreciated that layers, features, elements, etc. depicted herein are illustrated with particular dimensions relative to one another, such as structural dimensions or orientations, for example, for purposes of simplicity and ease of understanding and that actual dimensions of the same differ substantially from that illustrated herein, in some embodiments. Additionally, a variety of techniques exist for forming the layers, regions, features, elements, etc. mentioned herein, such as at least one of etching techniques, planarization techniques, implanting techniques, doping techniques, spin-on techniques, sputtering techniques, growth techniques, or deposition techniques such as CVD, for example.

Moreover, "exemplary" is used herein to mean serving as an example, instance, illustration, etc., and not necessarily as advantageous. As used in this application, "or" is intended to mean an inclusive "or" rather than an exclusive "or". In addition, "a" and "an" as used in this application and the appended claims are generally to be construed to mean "one or more" unless specified otherwise or clear from context to be directed to a singular form. Also, at least one of A and B and/or the like generally means A or B or both A and B. Furthermore, to the extent that "includes", "having", "has", "with", or variants thereof are used, such terms are intended to be inclusive in a manner similar to the term "comprising". Also, unless specified otherwise, "first," "second," or the like are not intended to imply a temporal aspect, a spatial aspect, an ordering, etc. Rather, such terms are merely used as identifiers, names, etc. for features, elements, items, etc. For example, a first element and a second element generally correspond to element A and element B or two different or two identical elements or the same element.

Also, although the disclosure has been shown and described with respect to one or more implementations, equivalent alterations and modifications will occur to others of ordinary skill in the art based upon a reading and understanding of this specification and the annexed drawings. The disclosure comprises all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure. In addition, while a particular feature of the disclosure may have been disclosed with respect to only one of several implementations, such feature may be combined with one or more other features of the other implementations as may be desired and advantageous for any given or particular application.

What is claimed is:

1. A method, comprising:
   performing, in-situ and according to a recipe, post chemical mechanical polishing (post-CMP) on a surface of a semiconductor wafer within a post-CMP chamber;
   testing a test reflected light signal reflected from a target area of the surface of the semiconductor wafer in response to a test light signal;
   adjusting, after testing the test reflected light signal, at least one light signal parameter based on at least one of the recipe performed by the post-CMP on the surface of the semiconductor wafer or a recipe parameter;
   scanning, in-situ and within the post-CMP chamber, a light signal over the target area of the surface of the semiconductor wafer after adjusting the at least one light signal parameter;
   detecting, in-situ and within the post-CMP chamber, a reflected light signal reflected from the target area; and
   determining a defect count of defects present in the target area based on the reflected light signal reflected from the target area.

2. The method of claim 1, comprising:
   performing, in-situ and within the post-CMP chamber, a second post-CMP on the target area of the surface of the semiconductor wafer responsive to the defect count exceeding a threshold.

3. The method of claim 1, comprising:
   adjusting at least one recipe parameter of the recipe responsive to the defect count exceeding a threshold to yield at least one adjusted recipe parameter.

4. The method of claim 3, comprising:
   performing, with the at least one adjusted recipe parameter, a second post-CMP on the target area of the surface of the semiconductor wafer.

5. The method of claim 3, comprising:
   performing, with the at least one adjusted recipe parameter, a second post-CMP on a surface of a second semiconductor wafer within the post-CMP chamber.

6. The method of claim 1, wherein:
   scanning the light signal over the target area of the surface of the semiconductor wafer comprises:
      scanning a first light signal over the target area; and
      scanning a second light signal over the target area;
   detecting the reflected light signal reflected from the target area comprises:
      detecting a first reflected light signal reflected from the target area; and detecting a second reflected light signal reflected from the target area; and determining the defect count of defects present in the target area comprises:

determining the defect count of defects present in the target area based on the first reflected light signal reflected from the target area and the second reflected light signal reflected from the target area.

7. The method of claim 6, wherein the first reflected light signal has a first wavelength and the second reflected light signal has a second wavelength different than the first wavelength.

8. The method of claim 6, wherein the first reflected light signal is detected at a first reflected angle relative to the surface of the semiconductor wafer, and the second reflected light signal is detected at a second reflected angle relative to the surface of the semiconductor wafer different than the first reflected angle.

9. The method of claim 1, wherein:

the light signal comprises at least one of:
 a discrete wavelength,
 a plurality of discrete wavelengths, or
 a range of wavelengths; and the range of wavelengths comprises at least one of:
 infrared wavelengths,
 near infrared wavelengths,
 optical wavelengths, or
 ultraviolet wavelengths.

10. The method of claim 1, wherein the at least one light signal parameter is at least one of:
 a wavelength of the light signal,
 an intensity of the light signal, or
 an incident angle of the light signal relative to the semiconductor wafer.

11. The method of claim 1, wherein the recipe parameter is at least one of:
 a clean time for applying a tool to the surface of the semiconductor wafer,
 a clean range for applying the tool about the surface of the semiconductor wafer,
 a downforce for applying the tool to the surface of the semiconductor wafer,
 a rotational speed for rotating the tool during contact with the surface of the semiconductor wafer, or
 an inclined angle for applying the tool to the surface of the semiconductor wafer.

12. The method of claim 1, wherein performing the post-CMP on the surface of the semiconductor wafer comprises at least one of:
 performing a brush mechanical scrubbing, during cylindrical rotation of a brush orthogonal to the surface of the semiconductor wafer, on the surface of the semiconductor wafer;
 performing a sponge mechanical scrubbing, during rotation of a sponge parallel to the surface of the semiconductor wafer, on the surface of the semiconductor wafer;
 performing a pencil pad mechanical scrubbing, during rotation of a pencil pad parallel to the surface of the semiconductor wafer, on the surface of the semiconductor wafer; or
 performing a brush pad mechanical scrubbing, during rotation of a brush pad parallel to the surface of the semiconductor wafer, on the surface of the semiconductor wafer.

13. The method of claim 1, wherein:
performing the post-CMP on the surface of the semiconductor wafer comprises:
 applying a spray, comprising at least one of a chemical spray or a water spray, to the surface of the semiconductor wafer within the post-CMP chamber; and
detecting the reflected light signal reflected from the target area is performed before drying the spray from the surface of the semiconductor wafer within the post-CMP chamber.

14. The method of claim 1, comprising:
positioning the semiconductor wafer on a stage within the post-CMP chamber in at least one of a horizontal orientation relative to a bottom surface of the post-CMP chamber or a vertical orientation relative to the bottom surface of the post-CMP chamber;
positioning a light source for scanning the light signal over the target area based on an orientation of the semiconductor wafer; and
positioning a detector for detecting the reflected light signal reflected from the target area based on the orientation of the semiconductor wafer.

15. A method, comprising:
positioning a semiconductor wafer on a stage within a post chemical mechanical polishing (post-CMP) chamber in at least one of a horizontal orientation relative to a bottom surface of the post-CMP chamber or a vertical orientation relative to the bottom surface of the post-CMP chamber;
positioning a light source for scanning a light signal over a target area of a surface of the semiconductor wafer based on an orientation of the semiconductor wafer;
positioning a detector for detecting a reflected light signal reflected from the target area based on the orientation of the semiconductor wafer;
performing, in-situ and according to a recipe, post-CMP on the surface of the semiconductor wafer within the post-CMP chamber;
scanning, in-situ and within the post-CMP chamber, the light signal over the target area using the light source;
detecting, in-situ and within the post-CMP chamber, the reflected light signal reflected from the target area using the detector; and
determining a defect count of defects present in the target area based on the reflected light signal reflected from the target area.

16. The method of claim 15, wherein:
performing the post-CMP on the surface of the semiconductor wafer comprises:
 applying a spray, comprising at least one of a chemical spray or a water spray, to the surface of the semiconductor wafer within the post-CMP chamber; and
detecting the reflected light signal reflected from the target area is performed before drying the spray from the surface of the semiconductor wafer within the post-CMP chamber.

17. The method of claim 15, wherein performing the post-CMP on the surface of the semiconductor wafer comprises at least one of:
 performing a brush mechanical scrubbing, during cylindrical rotation of a brush orthogonal to the surface of the semiconductor wafer, on the surface of the semiconductor wafer;
 performing a sponge mechanical scrubbing, during rotation of a sponge parallel to the surface of the semiconductor wafer, on the surface of the semiconductor wafer;

performing a pencil pad mechanical scrubbing, during rotation of a pencil pad parallel to the surface of the semiconductor wafer, on the surface of the semiconductor wafer; or performing a brush pad mechanical scrubbing, during rotation of a brush pad parallel to the surface of the semiconductor wafer, on the surface of the semiconductor wafer.

18. A method, comprising:

performing, in-situ and according to a recipe, post chemical mechanical polishing (post-CMP) on a surface of a semiconductor wafer within a post-CMP chamber, wherein performing the post-CMP on the surface of the semiconductor wafer comprises:

applying a spray, comprising at least one of a chemical spray or a water spray, to the surface of the semiconductor wafer within the post-CMP chamber;

scanning, in-situ and within the post-CMP chamber, a light signal over a target area of the surface of the semiconductor wafer;

detecting, in-situ and within the post-CMP chamber, a reflected light signal reflected from the target area before drying the spray from the surface of the semiconductor wafer within the post-CMP chamber; and determining a defect count of defects present in the target area based on the reflected light signal reflected from the target area.

19. The method of claim 18, wherein performing the post-CMP on the surface of the semiconductor wafer comprises at least one of:

performing a brush mechanical scrubbing, during cylindrical rotation of a brush orthogonal to the surface of the semiconductor wafer, on the surface of the semiconductor wafer;

performing a sponge mechanical scrubbing, during rotation of a sponge parallel to the surface of the semiconductor wafer, on the surface of the semiconductor wafer;

performing a pencil pad mechanical scrubbing, during rotation of a pencil pad parallel to the surface of the semiconductor wafer, on the surface of the semiconductor wafer; or performing a brush pad mechanical scrubbing, during rotation of a brush pad parallel to the surface of the semiconductor wafer, on the surface of the semiconductor wafer.

20. The method of claim 18, wherein:

scanning the light signal over the target area of the surface of the semiconductor wafer comprises:

scanning a first light signal over the target area; and scanning a second light signal over the target area;

detecting the reflected light signal reflected from the target area comprises:

detecting a first reflected light signal reflected from the target area; and detecting a second reflected light signal reflected from the target area;

determining the defect count of defects present in the target area comprises:

determining the defect count of defects present in the target area based on the first reflected light signal reflected from the target area and the second reflected light signal reflected from the target area; and at least one of:

the first reflected light signal has a first wavelength and the second reflected light signal has a second wavelength different than the first wavelength; or the first reflected light signal is detected at a first reflected angle relative to the surface of the semiconductor wafer, and the second reflected light signal is detected at a second reflected angle relative to the surface of the semiconductor wafer different than the first reflected angle.

* * * * *